(12) United States Patent
Okuda et al.

(10) Patent No.: US 7,687,907 B2
(45) Date of Patent: Mar. 30, 2010

(54) SEMICONDUCTOR DEVICE AND MANUFACTURING METHOD OF THE SAME

(75) Inventors: Hidekazu Okuda, Takasaki (JP); Haruo Amada, Kamisato (JP); Taizo Hashimoto, Maebashi (JP)

(73) Assignee: Renesas Technology Corp. (JP)

( * ) Notice: Subject to any disclaimer, the term of this patent is extended or adjusted under 35 U.S.C. 154(b) by 0 days.

(21) Appl. No.: 11/966,492

(22) Filed: Dec. 28, 2007

(65) Prior Publication Data

US 2008/0105971 A1 May 8, 2008

Related U.S. Application Data

(62) Division of application No. 11/100,598, filed on Apr. 7, 2005, now Pat. No. 7,335,574.

(30) Foreign Application Priority Data

Apr. 16, 2004 (JP) .............................. 2004-120997

(51) Int. Cl.
*H01L 23/48* (2006.01)
*H01L 23/52* (2006.01)
*H01L 29/40* (2006.01)

(52) U.S. Cl. .................. 257/737; 257/738; 257/750

(58) Field of Classification Search ................. 257/737, 257/738, 750, 751

See application file for complete search history.

(56) References Cited

U.S. PATENT DOCUMENTS

| 4,121,240 | A | * | 10/1978 | Katto .......................... 257/636 |
| 5,122,481 | A | | 6/1992 | Nishiguchi |
| 5,291,374 | A | * | 3/1994 | Hirata et al. ................. 361/760 |
| 6,204,558 | B1 | * | 3/2001 | Yanagida ..................... 257/737 |
| 6,927,167 | B2 | | 8/2005 | Fukuda et al. |
| 7,122,447 | B2 | | 10/2006 | Abe |
| 2003/0025184 | A1 | * | 2/2003 | Morozumi .................. 257/678 |

FOREIGN PATENT DOCUMENTS

| JP | 11-135533 | 5/1999 |
| JP | 2001-271494 | 10/2001 |
| JP | 2002-134441 | 5/2002 |
| JP | 2003-332271 | 11/2003 |

* cited by examiner

*Primary Examiner*—Phuc T Dang
(74) *Attorney, Agent, or Firm*—Mattingly & Malur, P.C.

(57) ABSTRACT

Provided is a technology capable of improving a production yield of a semiconductor device having, for example, IGBG as a semiconductor element. After formation of an interconnect on the surface side of a semiconductor substrate, a supporting substrate covering the interconnect is bonded onto the interconnect. Then, a BG tape is overlapped and bonded onto the supporting substrate and the semiconductor substrate is ground from the backside. The BG tape is then peeled off and an impurity is introduced into the backside of the semiconductor substrate by ion implantation. Then, the supporting substrate is peeled off, followed by heat treatment of the semiconductor substrate.

14 Claims, 41 Drawing Sheets

SEMICONDUCTOR DEVICE AND MANUFACTURING METHOD OF THE SAME

CROSS-REFERENCE TO RELATED APPLICATION

This application is a divisional application of U.S. application Ser. No. 11/100,598, filed Apr. 7, 2005, now U.S. Pat. No. 7,335,574, the entirety of which is incorporated herein by reference.

The present application claims priority from Japanese patent application No. 2004-120997 filed on Apr. 16, 2004, the content of which is hereby incorporated by reference in to this application.

BACKGROUND OF THE INVENTION

The present invention relates to a semiconductor device and a manufacturing method thereof, particularly to a technology effective when applied to a semiconductor device having an insulated gate biopolar transistor (IGBT).

A variety of technologies for mounting a semiconductor device on a packaging circuit substrate have been proposed.

For example, disclosed in Japanese Unexamined Patent Publication No. Hei 11 (1999)-135533 (Patent Document 1) is an electrode structure of a silicon semiconductor element which is placed over, for example, the surface of a silicon semiconductor, and comprises a first metal layer forming an ohmic contact with the silicon semiconductor and a second metal layer stacked to completely cover the whole exposed surface of the first metal layer, wherein the metal of the second metal layer has higher corrosion resistance to an organic acid and better solder wettability than the metal of the first metal layer.

In Japanese Unexamined Patent Publication No. 2001-271494 (Patent Document 2), disclosed is a semiconductor device characterized by that a surface electrode electrically connected to a semiconductor element has a plurality of conductive layers, of which the conductive layer physically connected to a surface pad electrode is made of a material having good adhesion to the material of the surface pad electrode and that physically connected to a bump is made of a material having good adhesion to the material of the bump.

In Japanese Unexamined Patent Publication No. 2002-134441 (Patent Document 3), disclosed is a manufacturing method of a power semiconductor device, which comprises processing the surface of a substrate, bonding a surface protective tape onto the surface of the substrate prior to deposition of a metal film, which will serve as an electrode, on the backside of the substrate, carrying out first dicing by making a cut line on the substrate along a dicing line from the backside of the substrate, removing the surface protective tape from the substrate surface after deposition of the metal film on the backside, and then carrying out second dicing.

In Japanese Unexamined Patent Publication No. 2003-332271 (Patent Document 4), disclosed is a technology of maintaining the strength of a semiconductor wafer even after the wafer is thinned, which comprises polishing the inner region on the backside of a semiconductor wafer to form a protrusion at the periphery of the backside of the semiconductor wafer, loading the semiconductor wafer on a stage having a surface smaller than the inner region of the semiconductor wafer, supporting the inner region on the backside of the semiconductor wafer by the stage, and cutting a scribe region on the surface of the semiconductor wafer.

[Patent Document 1] Japanese Unexamined Patent Publication No. Hei 11 (1999)-135533

[Patent Document 2] Japanese Unexamined Patent Publication No. 2001-271494

[Patent Document 3] Japanese Unexamined Patent Publication No. 2002-134441

[Patent Document 4] Japanese Unexamined Patent Publication No. 2003-332271

SUMMARY OF THE INVENTION

In the present invention, investigation was conducted using, for example, a pnp IGBT as a semiconductor element. In this pnp IGBT, an n type semiconductor wafer made of single crystal silicon serves as a base layer; a p type channel region, n type emitter region, emitter electrode, gate insulating film and gate electrode are formed on the surface side of the base layer; and a p type collector layer is formed on the backside.

The IGBT is manufactured, for example, in the following manner. A semiconductor element is formed on the surface side of a semiconductor wafer. After formation of an electrode to be electrically connected to the element, a portion of the electrode is exposed. The surface side of the semiconductor wafer is then covered with a polyimide film. A backgrinding tape (which will hereinafter be called "BG tape") is bonded onto the surface side of the semiconductor wafer and the semiconductor wafer is ground from the backside thereof to thin the semiconductor wafer to a predetermined thickness. Since electric current flows in the thickness direction of the semiconductor wafer, the thickness of the semiconductor wafer has a great influence on the performance of the IGBT. In order to improve the discharge characteristics of the IGBT, it is necessary to decrease the thickness of the semiconductor wafer and thereby reduce the thermal resistance. After formation of the semiconductor element on the surface side of the semiconductor wafer, therefore, the semiconductor wafer is ground from the backside thereof and thinned from about 550 μm to, for example, from 50 to 200 μm.

After washing the semiconductor wafer, a p type impurity is ion-implanted into the backside of the semiconductor wafer while reinforcing the semiconductor wafer with the BG tape. The BG tape is then peeled off and thermal treatment is performed, whereby the p type impurity is activated and a collector layer is formed. A first metal film is then deposited by sputtering or vacuum deposition on the backside of the semiconductor wafer, whereby a collector electrode is formed. A second metal film is then formed by electroplating over the surface of the electrode exposed on the surface side of the semiconductor wafer.

After the grinding of the semiconductor wafer, however, foreign materials including silicon dust which have been created by grinding stick to the surface of the BG tape. Foreign materials also adhere to the backside of the semiconductor wafer and they cannot be removed easily by washing. Upon ion-implantation of a p type impurity into the backside of the semiconductor wafer, these foreign materials disturb the introduction of the p type impurity, cause defects in the collector layer to be formed by the subsequent heat treatment, and thereby lower a production yield of the IGBT.

The ion implantation of the p type impurity into the backside of the semiconductor wafer is followed by heat treatment. Since a polyimide resin film has been formed on the surface side of the semiconductor wafer, the thermal treatment temperature is determined, depending on the heat resistant temperature of the polyimide resin film. In order to activate the p type impurity, heat treatment of about 800° C. is necessary. The upper limit of the heating temperature of the polyimide resin film is however about 420° C., at which the activation ratio of the p type impurity is below 10%. This leads to a problem that the IBGT thus manufactured does not have desired properties. Upon formation of the second metal film over the surface of the electrode by electroless plating, a bridging phenomenon, that is, undesirable formation of a metal layer over the polyimide resin film, occurs, which sometimes causes an electric short-circuit failure.

An object of the present invention is to provide a technology capable of improving a production yield of a semiconductor device having, for example, an IGBT as a semiconductor element.

The above-described and the other objects and novel features of the invention will be apparent from the description herein and accompanying drawings.

The following is a brief description of the typical invention, among the inventions disclosed herein.

The present invention is characterized by that after formation of a semiconductor element and interconnect on the surface side of a semiconductor substrate, bonding a supporting substrate onto the semiconductor element and interconnect to cover them therewith, overlapping and bonding a BG tape onto the supporting substrate, grinding the semiconductor substrate from the backside thereof, peeling off the BG tape, introducing an impurity by ion-implantation into the backside of the semiconductor substrate, peeling off the supporting substrate, and then heat treating the semiconductor substrate.

Advantages available by the typical inventions, among the inventions disclosed herein, will next be described briefly.

A production yield of a semiconductor device having an IGBT as a semiconductor element can be improved.

DETAILED DESCRIPTION OF THE PREFERRED EMBODIMENTS

Figure 1:
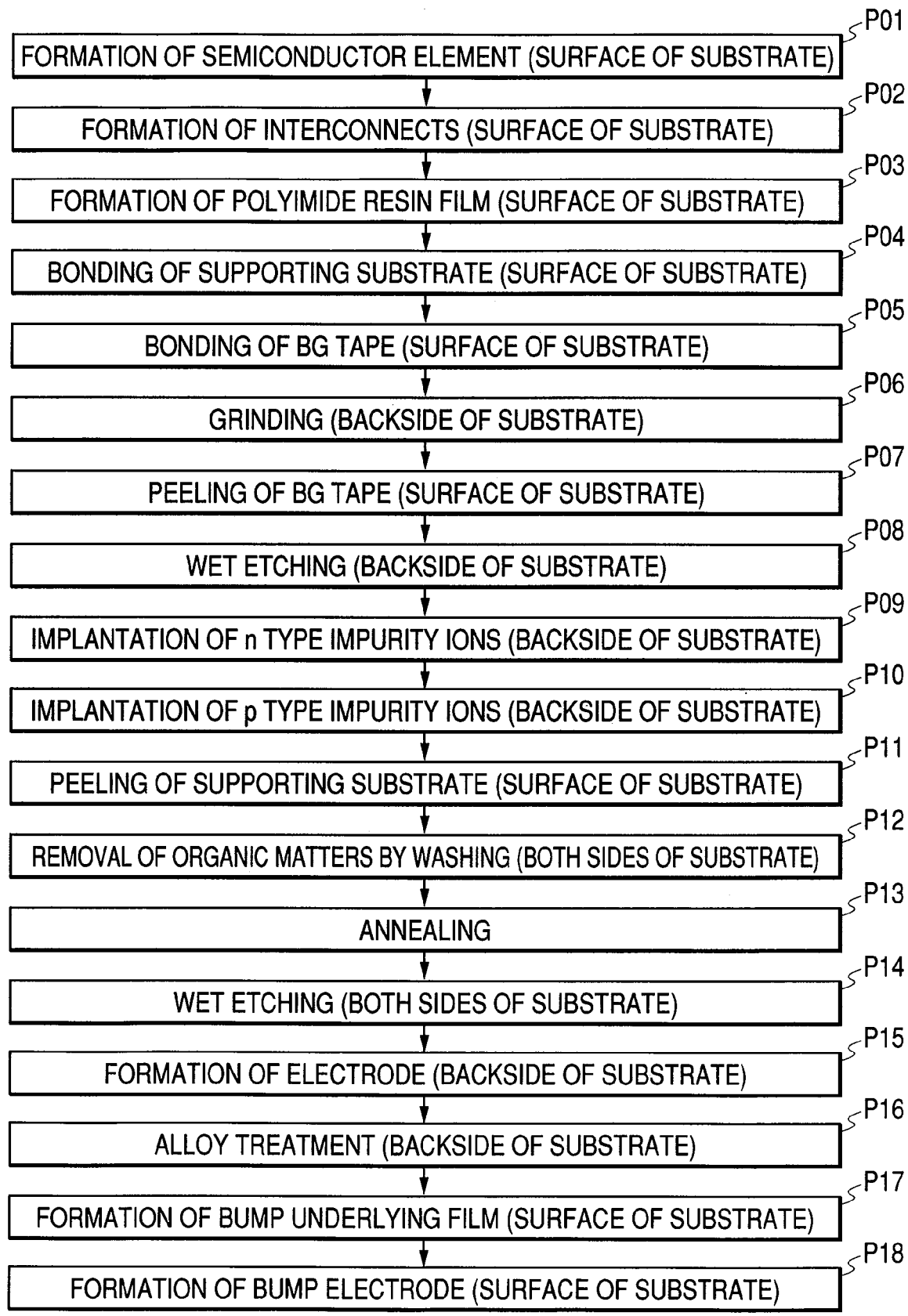
FIG. 1 is a flow chart explaining a manufacturing method of a semiconductor device according to Embodiment 1 of the invention.

Embodiments of the present invention will hereinafter be described specifically based on accompanying drawings. In all the drawings for explaining the embodiments, members having like function will be identified by like reference numerals and overlapping descriptions will be omitted.

Embodiment 1

A semiconductor device according to Embodiment 1 has, for example, an IGBT as a semiconductor element. Such a semiconductor device of Embodiment 1 will next be described in accordance with manufacturing steps based on FIGS. 1 to 31. FIG. 1 is a flow chart of a manufacturing method of the semiconductor device according to Embodiment 1.

Figure 2:
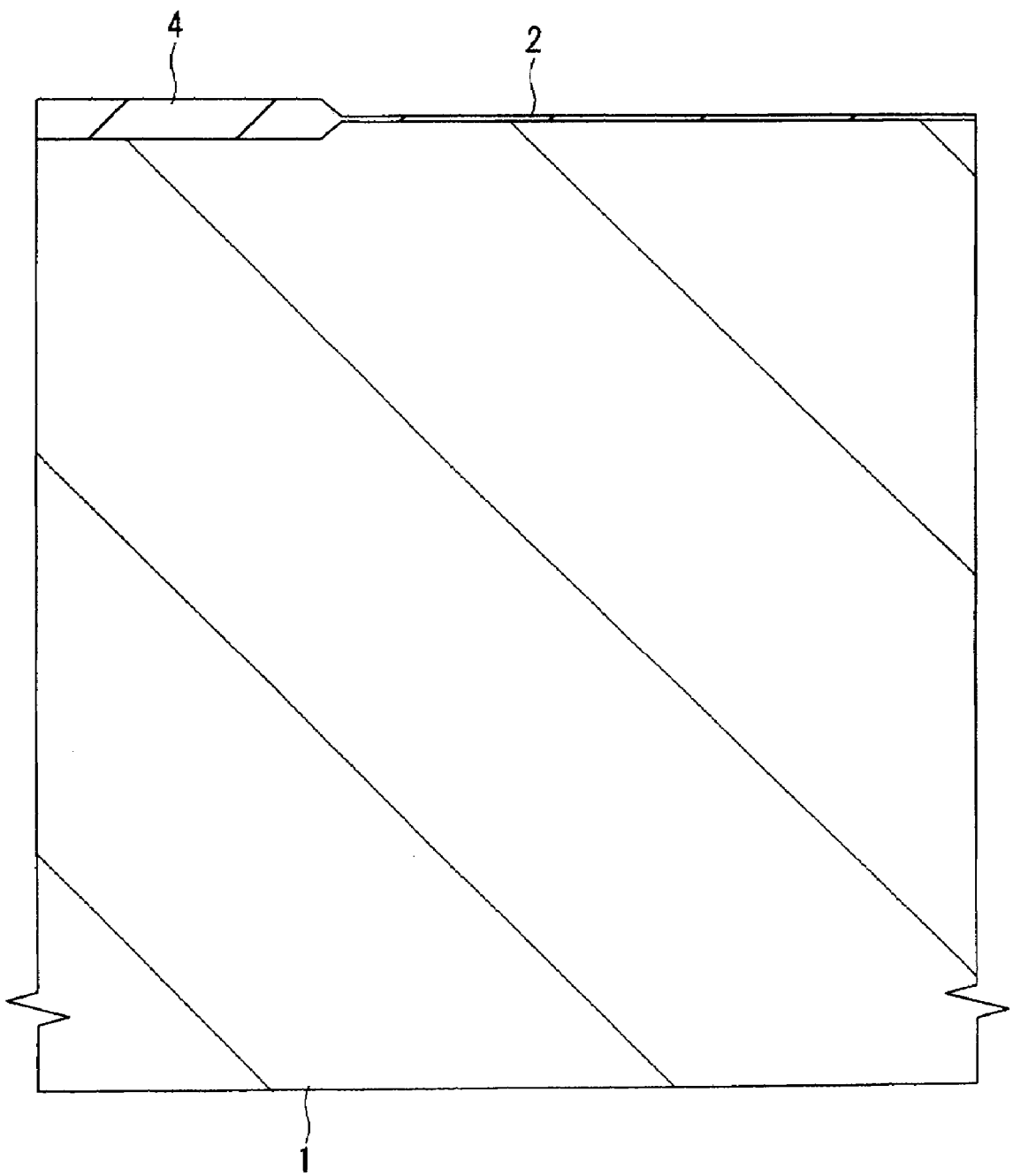
FIG. 2 is a fragmentary cross-sectional view explaining the manufacturing method of the semiconductor device according to Embodiment 1 of the invention.

As illustrated in FIG. 2, a semiconductor substrate (which will hereinafter be described "substrate" simply) 1 made of an $n^+$ type single crystal silicon having an impurity of n type conductivity (for example, arsenic (As)) doped therein is prepared in advance. The substrate 1 at this stage is a planar and substantially circular thin plate of a semiconductor which is called semiconductor wafer. It has a thickness of, for example, about 550 µm. The surface (first surface) of the substrate 1 is then thermally oxidized to form a silicon oxide film 2.

Over the silicon oxide film 2, a silicon nitride film patterned by photolithography is formed, followed by thermal treatment of the substrate 1, whereby a field insulating film 4 is formed over the silicon-nitride-film-free surface of the substrate 1. This field insulating film 4 serves as an element isolation region and a region isolated by this region becomes an element formation region. The silicon nitride film is then removed by washing of the substrate 1 with hydrofluoric acid and then hot phosphoric acid.

Figure 3:
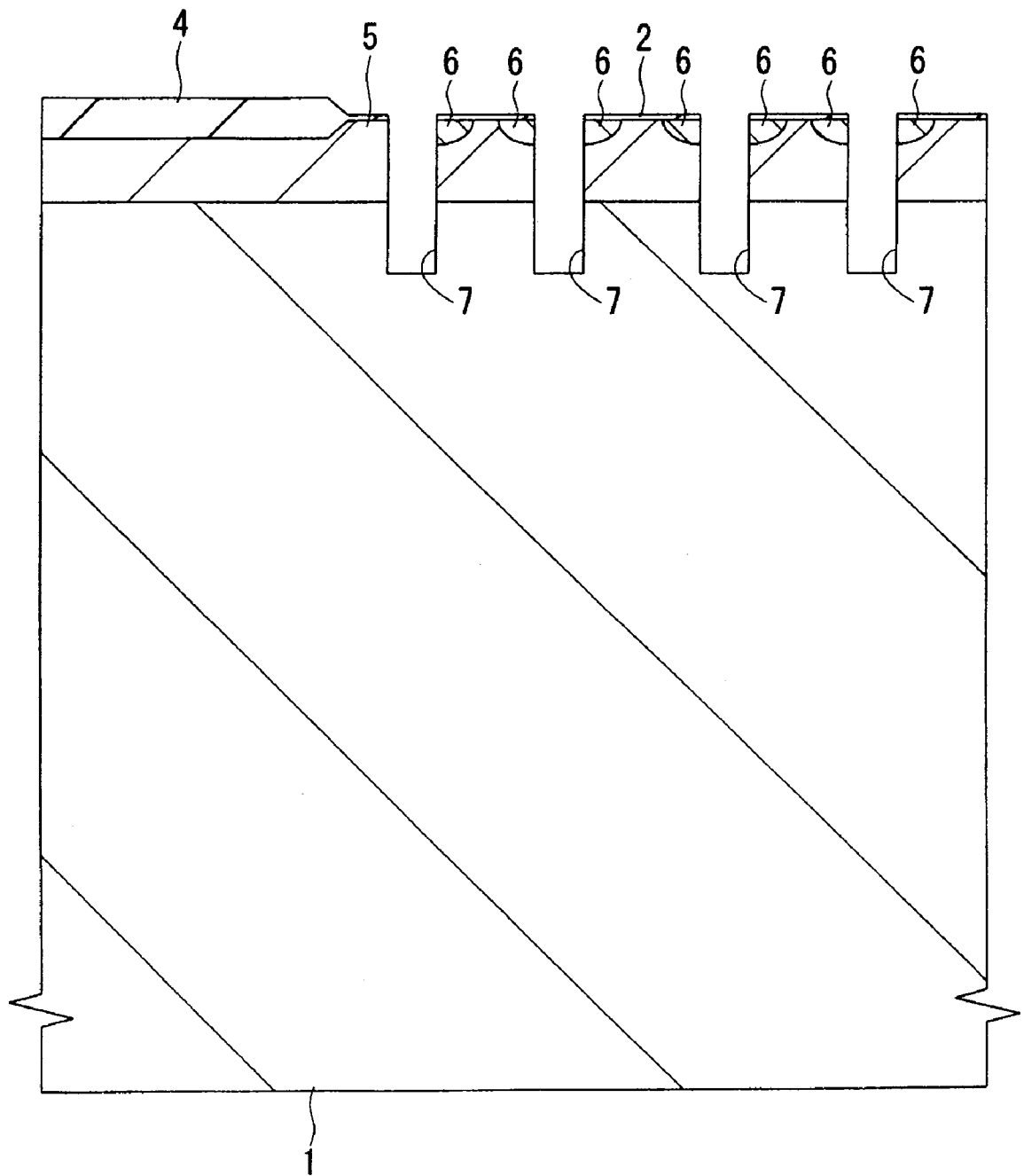
FIG. 3 is a fragmentary cross-sectional view illustrating the semiconductor device during its manufacturing step following that of FIG. 2.

As illustrated in FIG. 3, with a photoresist film patterned by photolithography as a mask, an impurity (for example, boron (B)) of p type conductivity is ion-implanted into the substrate 1. The substrate 1 is then heat treated to diffuse the impurity, whereby a $p^-$ type semiconductor region 5 is formed. This $p^-$ type semiconductor region 5 serves as a channel region of the IGBT.

With a photoresist film patterned by photolithography as a mask, the silicon oxide film 2 and substrate 1 are etched successively to form a trench 7. With a photoresist film patterned by photolithography as a mask, an impurity (for example, arsenic) of n type conductivity is ion-implanted into the substrate 1. The substrate 1 is then heat treated to diffuse the impurity, whereby an $n^+$ type semiconductor region 6 is formed. This $n^+$ type semiconductor region 6 serves as an emitter region of the IGBT.

Figure 4:
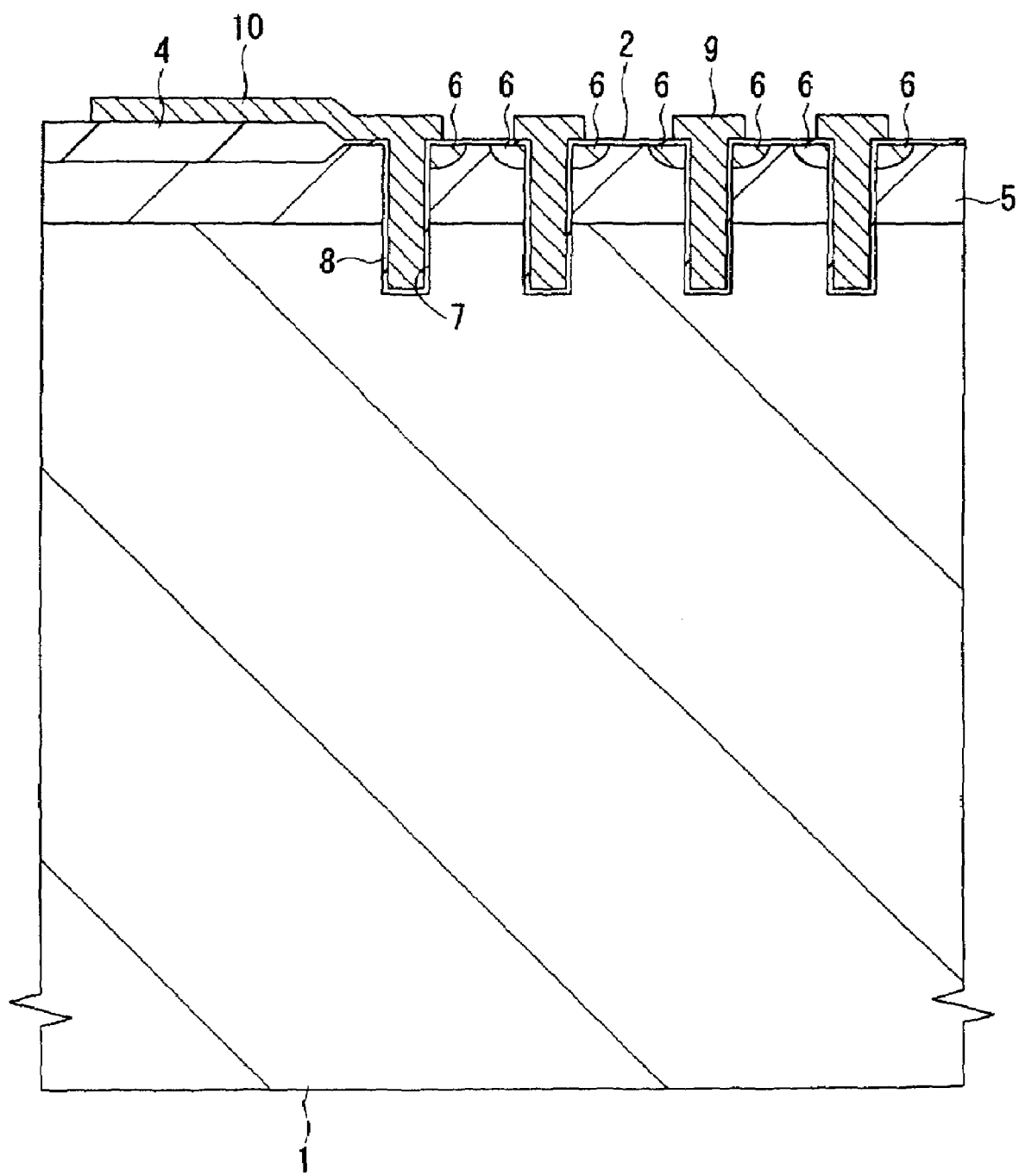
FIG. 4 is a fragmentary cross-sectional view illustrating the semiconductor device during its manufacturing step following that of FIG. 3.

As illustrated in FIG. 4, the substrate 1 is heat treated to form a thermal oxide film 8 over the bottom and side walls of the trench 7. This thermal oxide film 8 serves as a gate insulating film of the IGBT.

A polycrystalline silicon film having an impurity (for example, phosphorus (P)) of n type conductivity doped therein is deposited over the silicon oxide film 2 including the inside of the trench 7 to fill the trench 7 with the polycrystalline silicon film. With a photoresist film patterned by photolithography as a mask, the polycrystalline silicon film is etched to leave the polycrystalline silicon film in the trench 7, whereby a gate electrode 9 of the IGBT is formed in the trench 7. At this time, the polycrystalline silicon film is also left over a portion of the field insulating film 4 to form a polycrystalline silicon pattern 10. This polycrystalline silicon pattern 10 is electrically connected to the gate electrode 9. By the steps so far mentioned, a portion of the IGBT, that is, a base region made of the substrate 1 and an emitter region made of the $n^+$ type semiconductor region 6 are formed over the surface side of the substrate 1 (Step P01 of FIG. 1).

Figure 5:
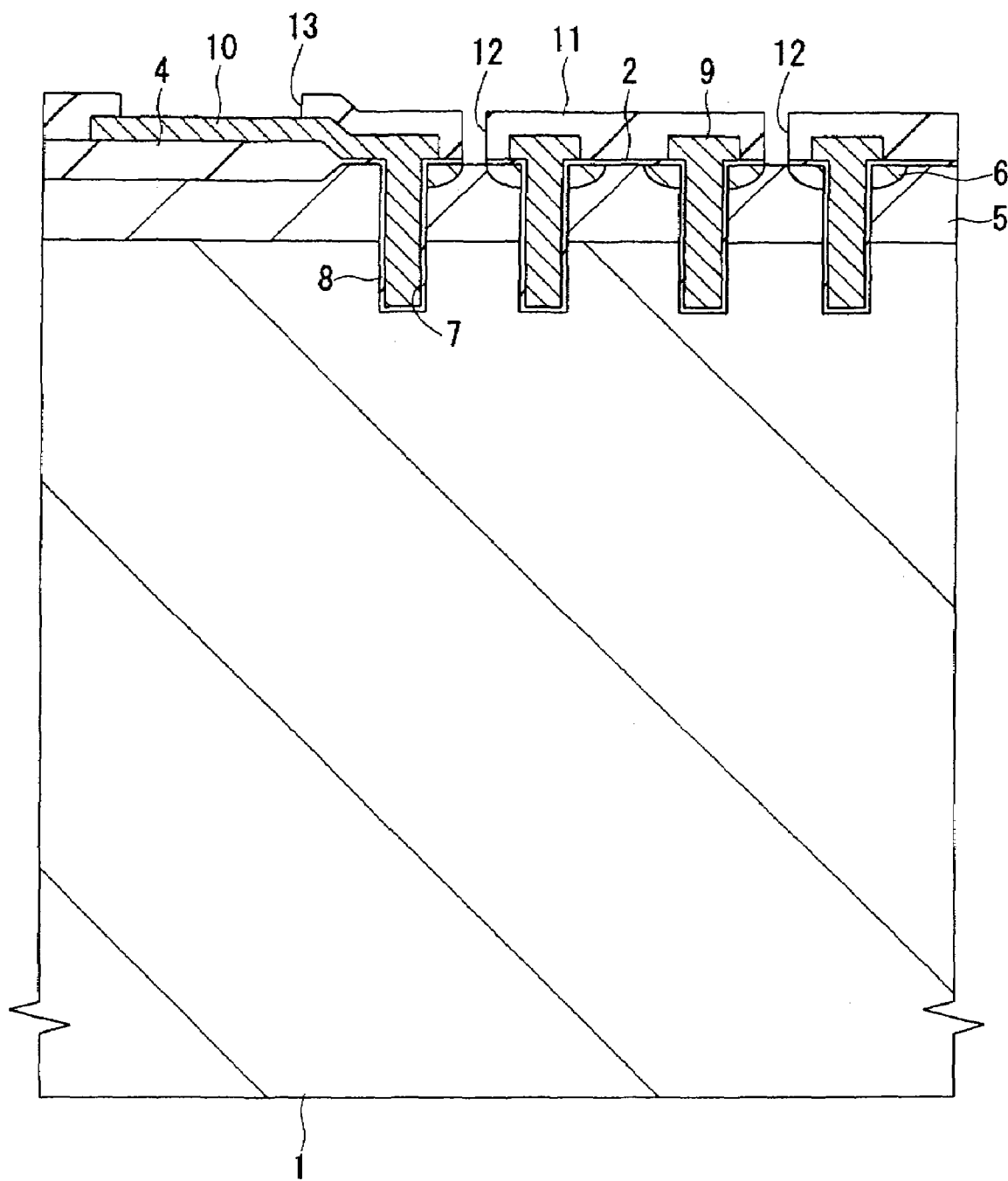
FIG. 5 is a fragmentary cross-sectional view illustrating the semiconductor device during its manufacturing step following that of FIG. 4.

As illustrated in FIG. 5, after deposition of a PSG (Phospho Silicate Glass) film over the substrate 1, an SOG (Spin On Glass) film is formed over the PSG film by the method of application, whereby an insulating film 11 made of the PSG film and the SOG film is formed. With a photoresist film patterned by photolithography as a mask, the insulating film 11 and silicon oxide film 2 are etched successively to form a contact via 12. At this time, the insulating film 11 over the polycrystalline silicon pattern is patterned and a contact via 13 reaching the polycrystalline silicon pattern 10 is formed.

Figure 6:
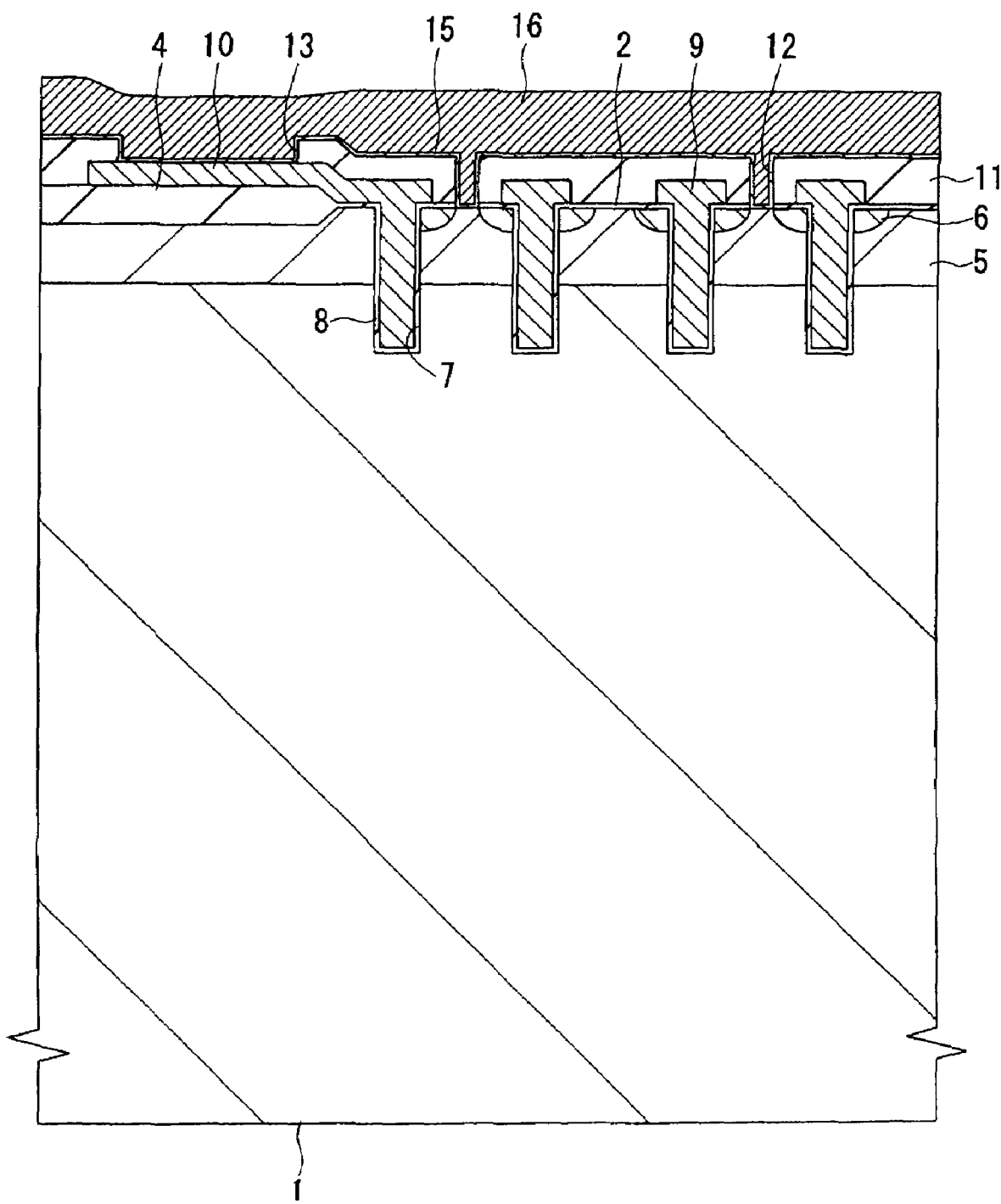
FIG. 6 is a fragmentary cross-sectional view illustrating the semiconductor device during its manufacturing step following that of FIG. 5.

As illustrated in FIG. 6, a barrier conductor film 15 is formed over the insulating film 11 including the insides of the contact vias 12 and 13. This barrier conductor film is formed, for example, by depositing a thin titanium tungsten (TiW) film by sputtering and then heat treating the substrate 1.

Figure 7:
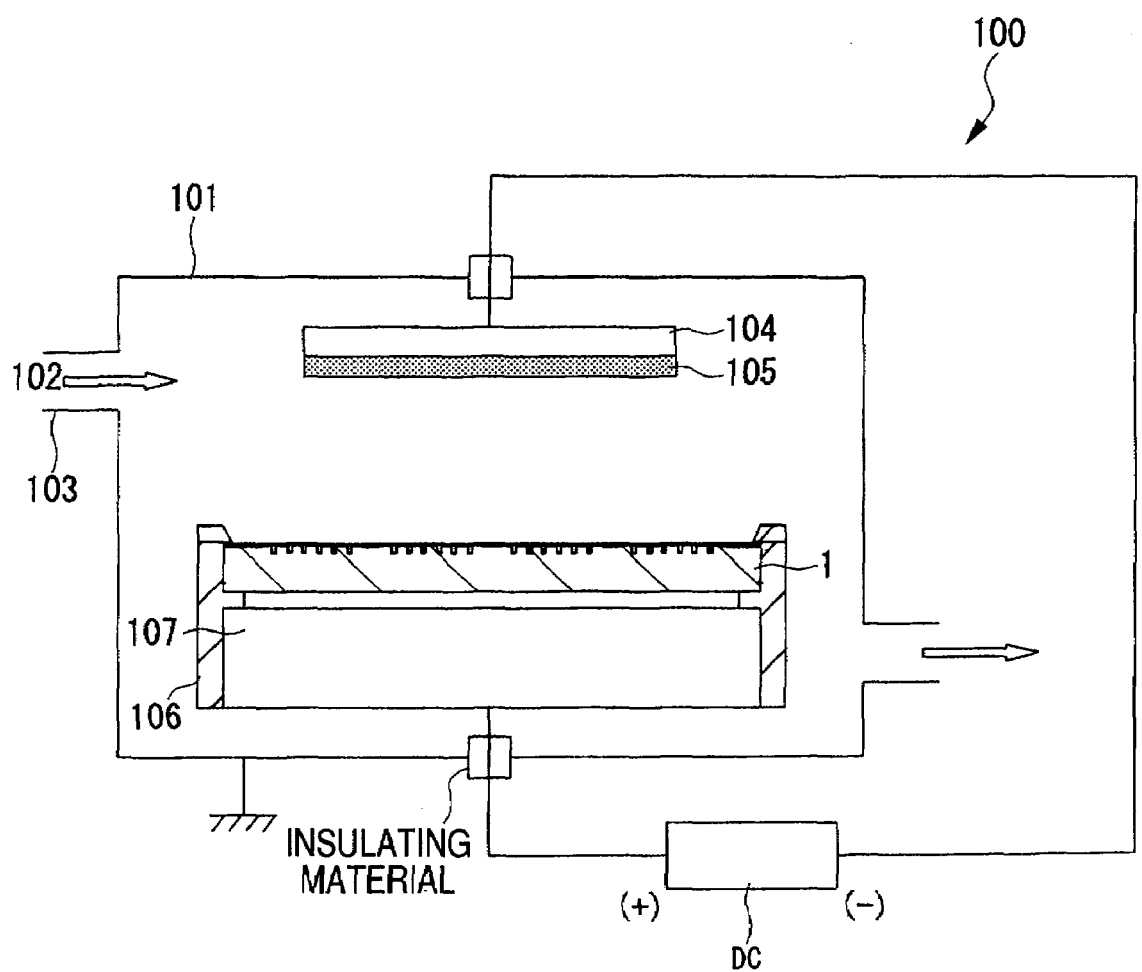
FIG. 7 is a schematic view of a DC magnetron sputtering apparatus used for the manufacture of the semiconductor device according to Embodiment 1 of the invention.

FIG. 7 is a schematic view of a DC magnetron sputtering apparatus to be used for the manufacture of a semiconductor device. This sputtering apparatus 100 is equipped with a sputtering chamber 101 which is evacuated by a vacuum pump such as cryopump or dry pump. The sputtering chamber 101 has a passage for carrying the substrate 1 in or out of the chamber and it is opened or closed by a gate valve. In the sputtering chamber 101, a gas feed pump 13 for feeding an argon (Ar) gas 102 as an inactive and massive discharge gas for generating ions is inserted.

Onto the upper part of the sputtering chamber 101, a target 105 is interchangeably attached while being in contact with a cathode electrode 104. The target 105 is made of, for example, titanium tungsten and it is in the disc form. On the bottom of the sputtering chamber 101, the substrate 1 supported by a wafer clamper 106 is disposed opposite to the target 105. The substrate 1 is electrically connected to an anode electrode 107. Between the cathode electrode 104 and anode electrode 107, a power supply unit DC for applying a DC voltage is connected.

When a DC voltage is applied with the target 105 as a cathode and the substrate 1 as anode, an argon ion converted into plasma by a high electric field has acquired a high speed and collides with the target 105. The composition of the target 105 then jumps out therefrom by the argon ion, sticks onto the substrate 1 and forms a titanium tungsten film.

A conductive film 16 is then laid over the barrier conductor film 15 so as to fill the contact vias 12 and 13 therewith. This conductive film 16 is, for example, an aluminum alloy (AlSi) film formed by sputtering method.

Figure 8:
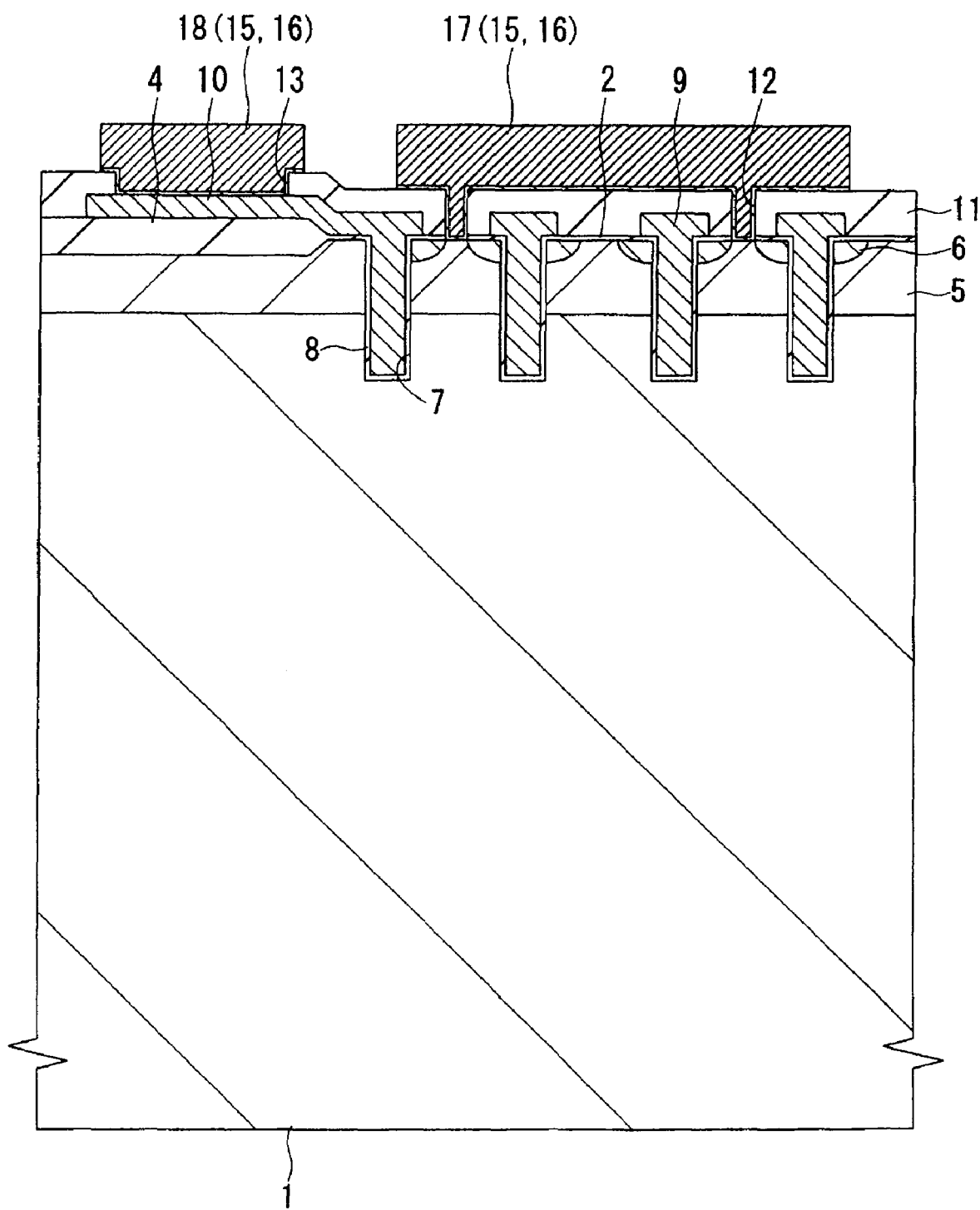
FIG. 8 is a fragmentary cross-sectional view illustrating the semiconductor device during its manufacturing step following that of FIG. 6.

As illustrated in FIG. 8, with a photoresist film patterned by photolithography as a mask, the conductive film 16 and barrier conductor film 15 are etched successively, whereby interconnects 17 and 18 each made of the conductive film 16 and barrier conductor film 15 are formed (Step P02 of FIG. 1). The interconnect 17 serves as an emitter electrode electrically connected to the n$^+$ semiconductor region 6, while the interconnect 18 serves as a gate interconnect electrically connected to the gate electrode 9 via the polycrystalline silicon pattern 10.

Figure 9:
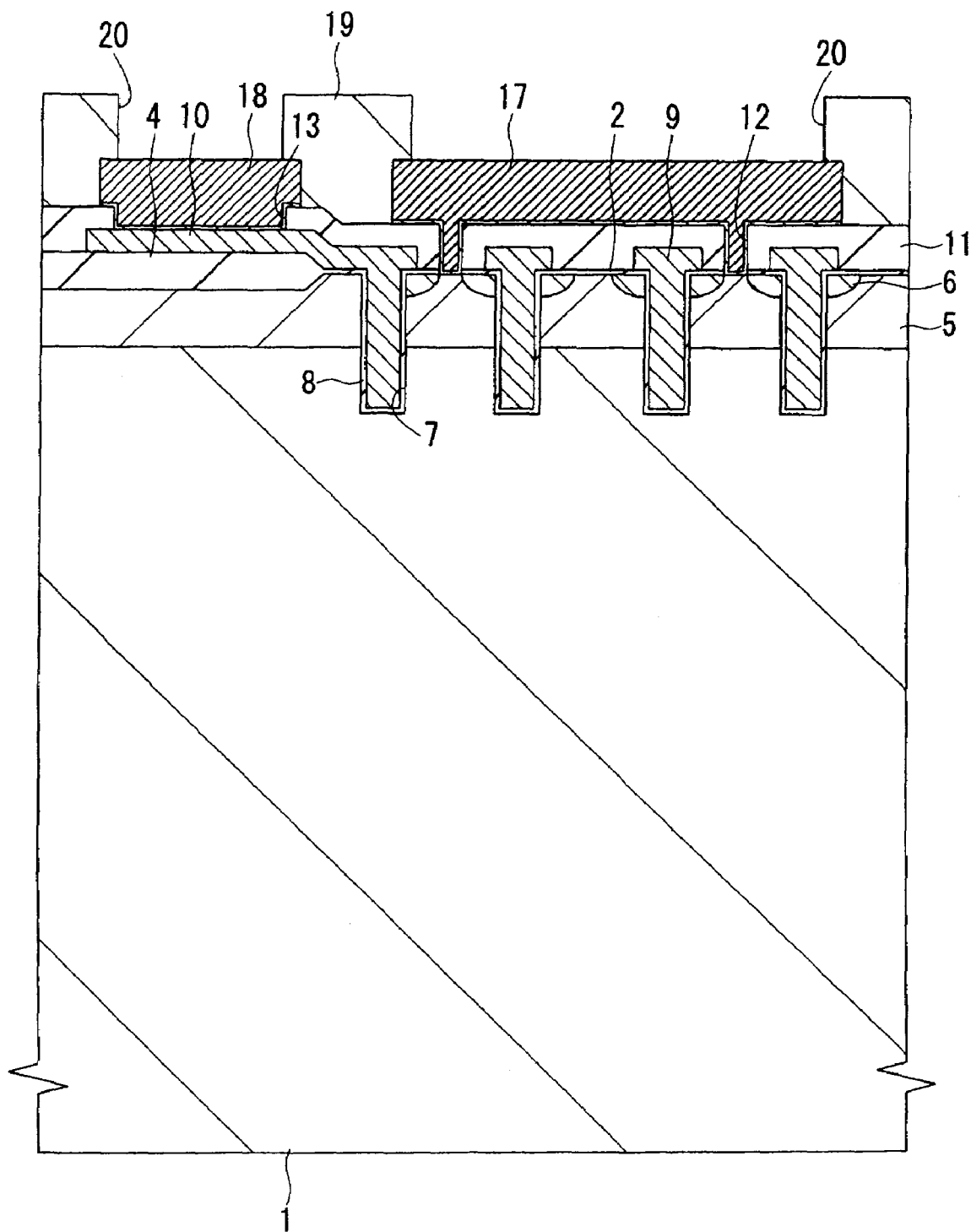
FIG. 9 is a fragmentary cross-sectional view illustrating the semiconductor device during its manufacturing step following that of FIG. 8.

As illustrated in FIG. 9, a polyimide resin film (protective film) of about 10 μm thick is formed, for example, by the method of application. In Embodiment 1, the polyimide resin film 19 may be either a photosensitive or non-photosensitive film. This polyimide resin film 19 is the uppermost layer film deposited on the surface side of the substrate 1 and protects the element and interconnects (Step P03 of FIG. 1).

With a photoresist film patterned by photolithography as a mask, the polyimide resin film 19 is etched to form openings 20 over the interconnect 17 serving as an emitter electrode and interconnect 18 electrically connected to the polycrystalline silicon pattern 10, while leaving a polyimide resin film 19 in the other region.

Figure 10:
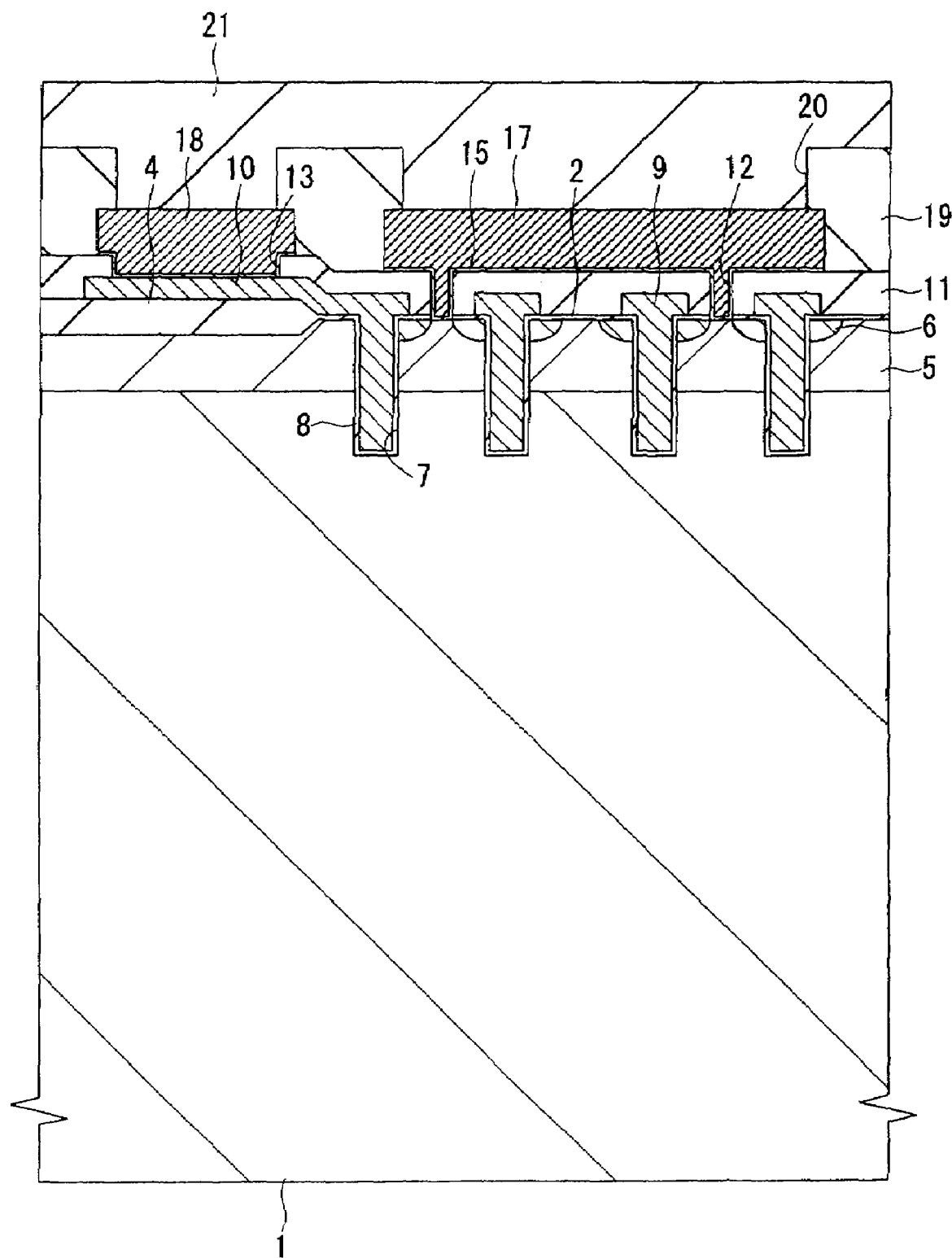
FIG. 10 is a fragmentary cross-sectional view illustrating the semiconductor device during its manufacturing step following that of FIG. 9.

As illustrated in FIG. 10, a supporting substrate (first tape) 21 is bonded onto the polyimide resin film 19 (Step P04 of FIG. 1). As the supporting substrate 21, a high rigidity tape made of PET (polyethylene terephthalate) can be used. The thickness of the high rigidity tape is, for example, about 165 μm.

Figure 11:
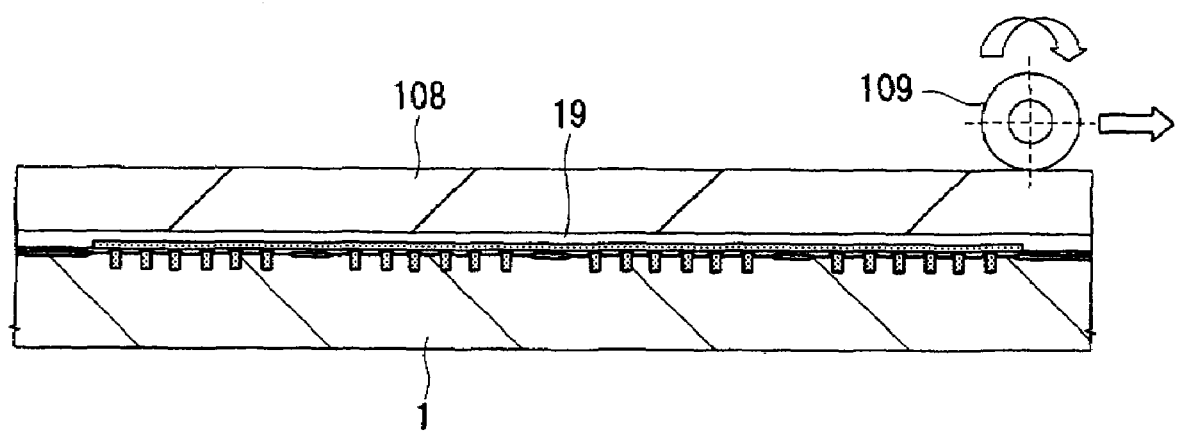
FIG. 11 is an explanatory view of a bonding method of a supporting plate employed for the manufacture of the semiconductor device according to Embodiment 1 of the invention.

FIG. 11 is an explanatory view of a supporting substrate bonding method to be employed for the manufacture of a semiconductor device. A high rigidity tape is used as the supporting substrate. With an adhesive which has been applied to the high rigidity tape 108, the tape is bonded onto the polyimide resin film 19 which is an uppermost layer on the side of the substrate 1 while being pressed by a rolling applicator 109. The high rigidity tape 108 has PET as a base material, an adhesive applied thereto, and a peeling material made of polyester attached to the adhesive. The peeling material is, for example, release paper and the high rigidity tape 108 is attached to the substrate 1 by removing the peeling material. Alternatively, a high rigidity tape not having a peeling material but having a substrate, on the backside thereof, subjected to release treatment may be used. Instead of the high rigidity tape 108, glass or ceramic may be used. When glass is employed, its thickness is, for example, about 700 μm. Glass is advantageous because its impurity content is small. When ceramic is used, its thickness is, for example, about 650 μm. It exhibit good heat resistance up to about 400° C.

Figure 12:
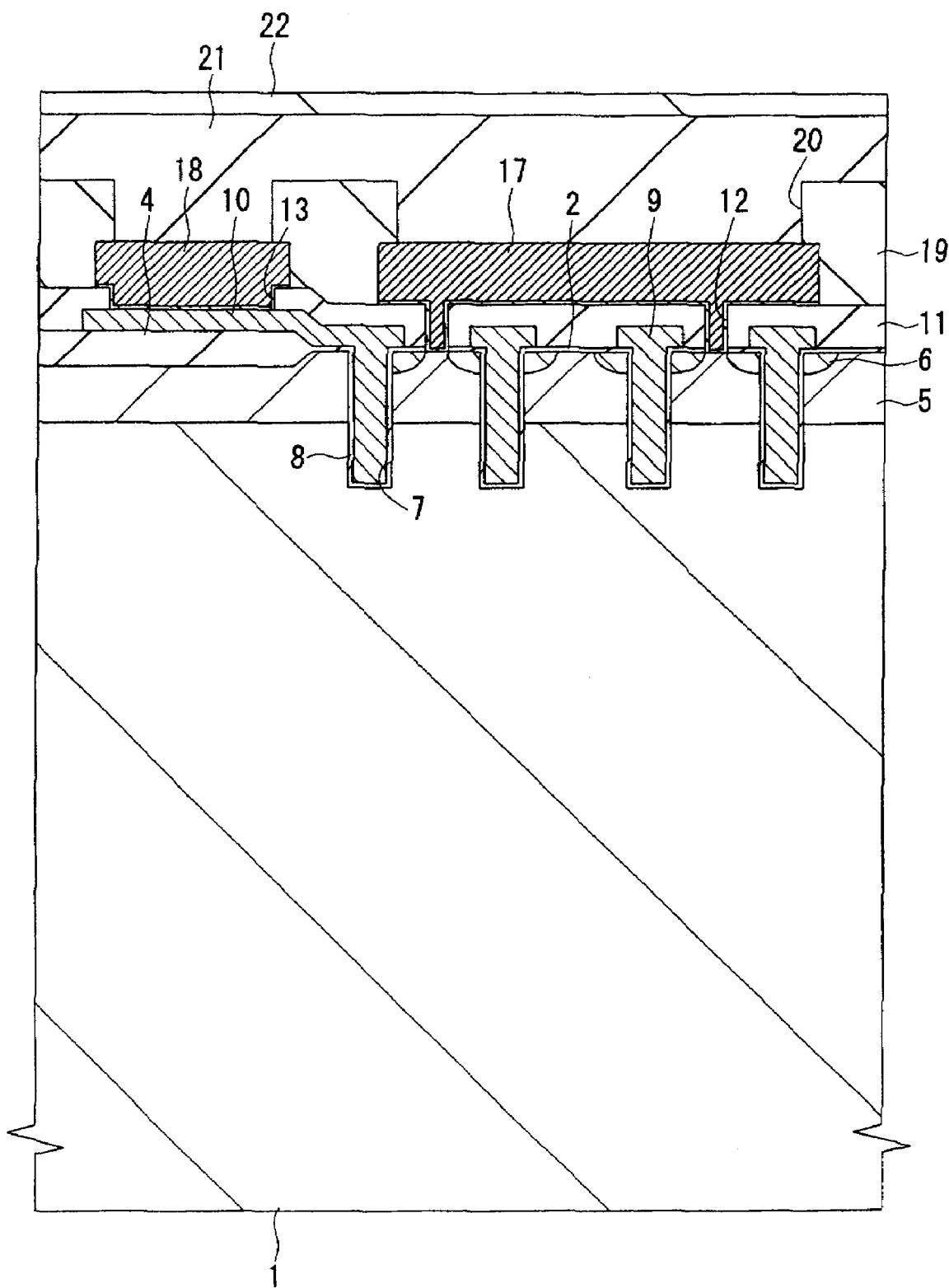
FIG. 12 is a fragmentary cross-sectional view illustrating the semiconductor device during its manufacturing step following that of FIG. 10.

As illustrated in FIG. 12, a BG tape (second tape) 22 is bonded onto the supporting substrate 21, whereby the surface of the substrate 1 is protected by a two-layer protective tape (Step P05 of FIG. 1). As the BG tape 22, a thermally foamed tape made of, for example, PET can be used. The BG tape 22 has a thickness of, for example, from about 50 to 100 μm.

Figure 13:
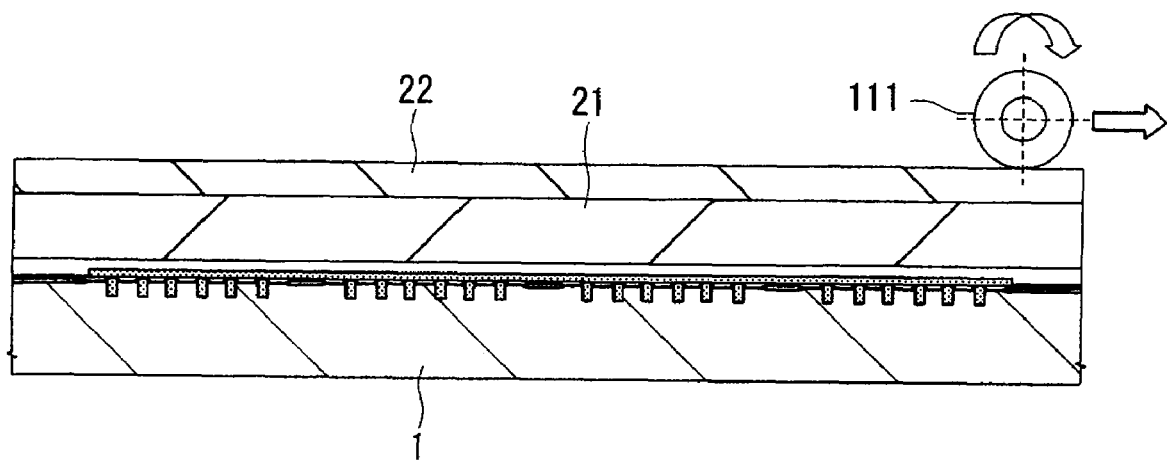
FIG. 13 is an explanatory view of a bonding method of a BG tape employed for the manufacture of the semiconductor device according to Embodiment 1 of the invention.

FIG. 13 is an explanatory view of a BG tape bonding method to be employed for the manufacture of a semiconductor device. An adhesive has been applied to the BG tape 22 and the BG tape 22 is bonded onto the supporting substrate 21 while being pressed by a rolling applicator 111. The BG tape 22 has PET as a base material, an adhesive applied thereto, and a peeling material made of polyester attached to the adhesive. The peeling material is, for example, release paper and the BG tape 22 is bonded to the supporting substrate 21 by removing the peeling material. Alternatively, a high rigidity tape not having a peeling material but having a substrate, on the backside thereof, subjected to release treatment may be used.

Figure 14:
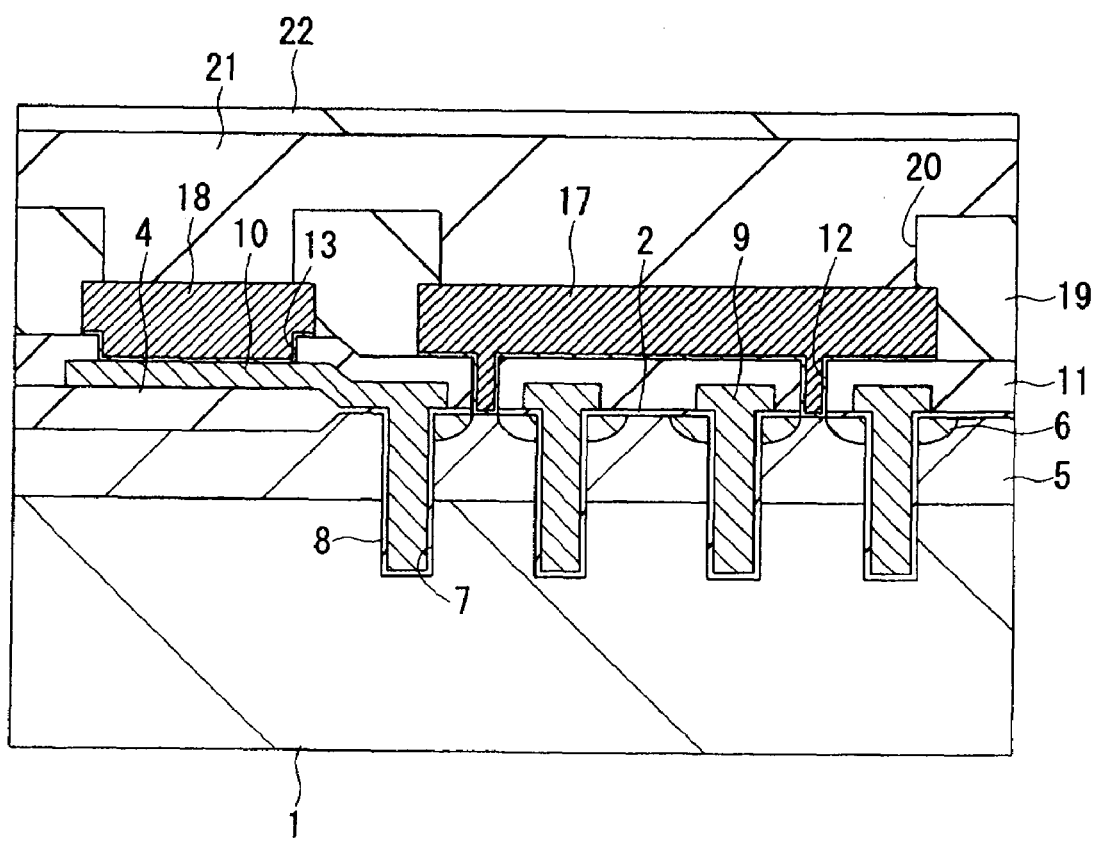
FIG. 14 is a fragmentary cross-sectional view illustrating the semiconductor device during its manufacturing step following that of FIG. 12.

As illustrated in FIG. 14, the substrate 1 is ground from the backside (second surface) thereof with the surface side protected by the supporting substrate 21 and BG tape 22 down. The thickness of the substrate 1 is reduced to, for example, from about 50 to 200 μm (Step P06 of FIG. 1), preferably to a thickness of 120 μm or less. The surface side of the substrate 1 has been protected by the protective tape (supporting substrate 21 and BG tape 22) so that the element and interconnects are free from damage.

Figure 15:
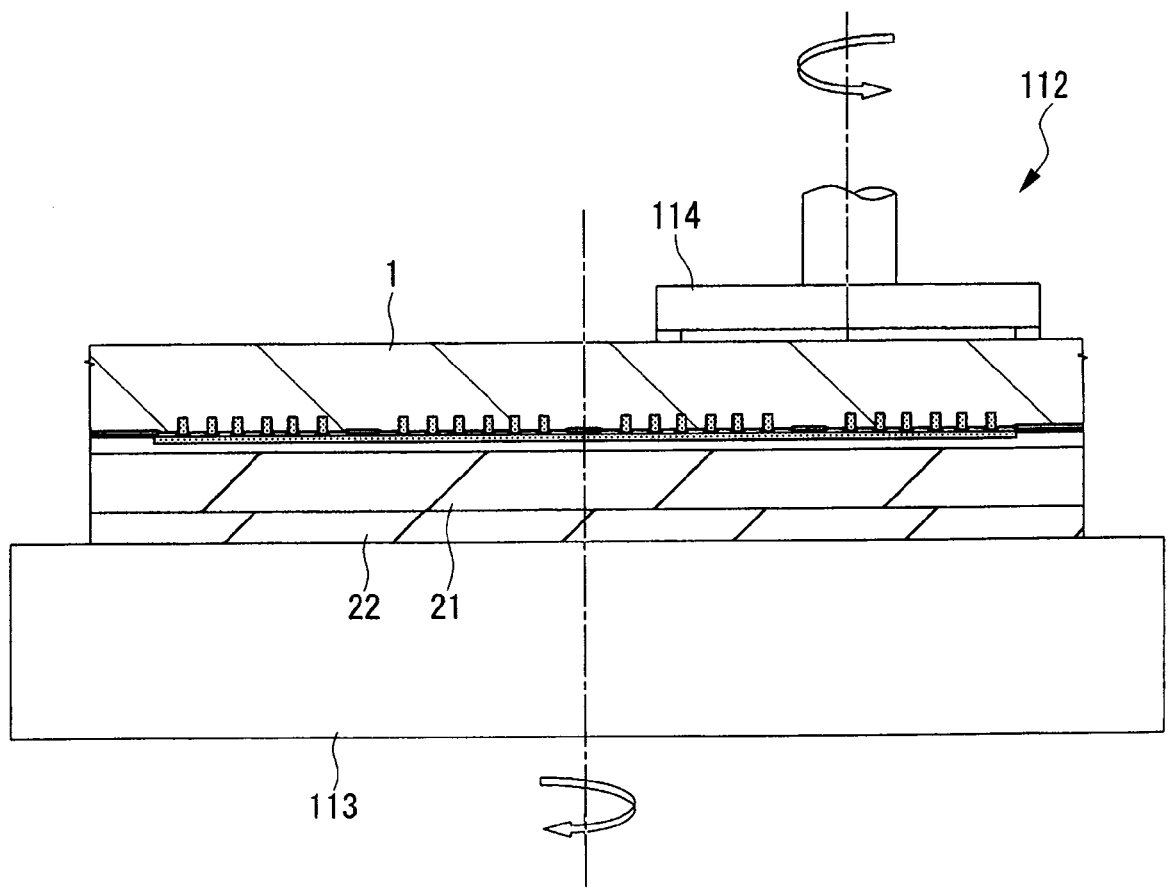
FIG. 15 is an explanatory view of a back grinding method employed for the manufacture of the semiconductor device according to Embodiment 1 of the invention.

FIG. 15 is an explanatory view of a back grinding method to be used for the manufacture of a semiconductor device. The substrate 1 is carried in a grinder apparatus 112. After vacuum adsorption of the surface side of the substrate 1 to a chuck table 113, the backside of the substrate 1 is ground by pressing, against it, a rolling grinding material (for example, grinding wheel) 114, whereby the substrate 1 can be reduced to a predetermined thickness.

Figure 16:
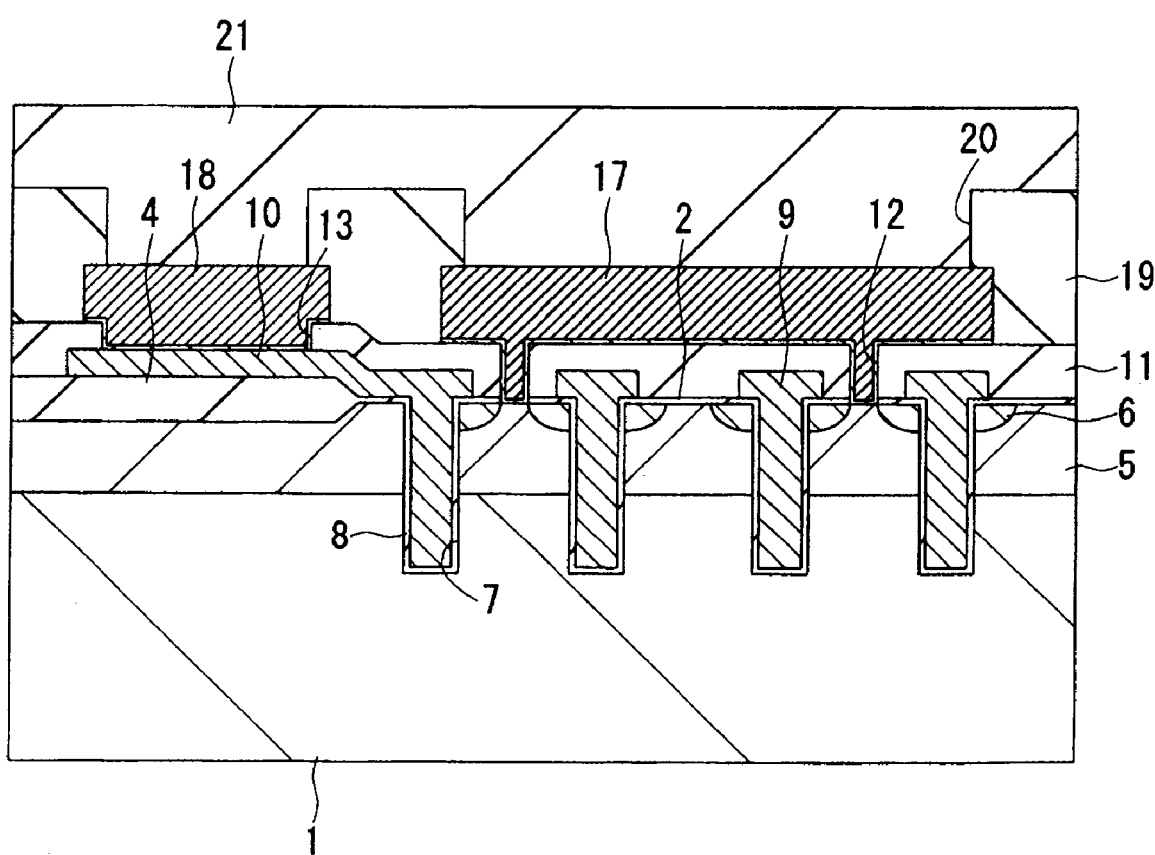
FIG. 16 is a fragmentary cross-sectional view illustrating the semiconductor device during its manufacturing step following that of FIG. 14.

As illustrated in FIG. 16, the BG tape 22 is peeled off from the supporting substrate 21 (Step P07 of FIG. 1). Although foreign materials including silicon dust which have remained after the grinding of the backside of the substrate 1 are bonded to the surface of the BG tape 22, they are removed simultaneously with the peeling-off of the BG tape 22, whereby intrusion of the foreign materials into the subsequent steps is prevented.

Figure 17:
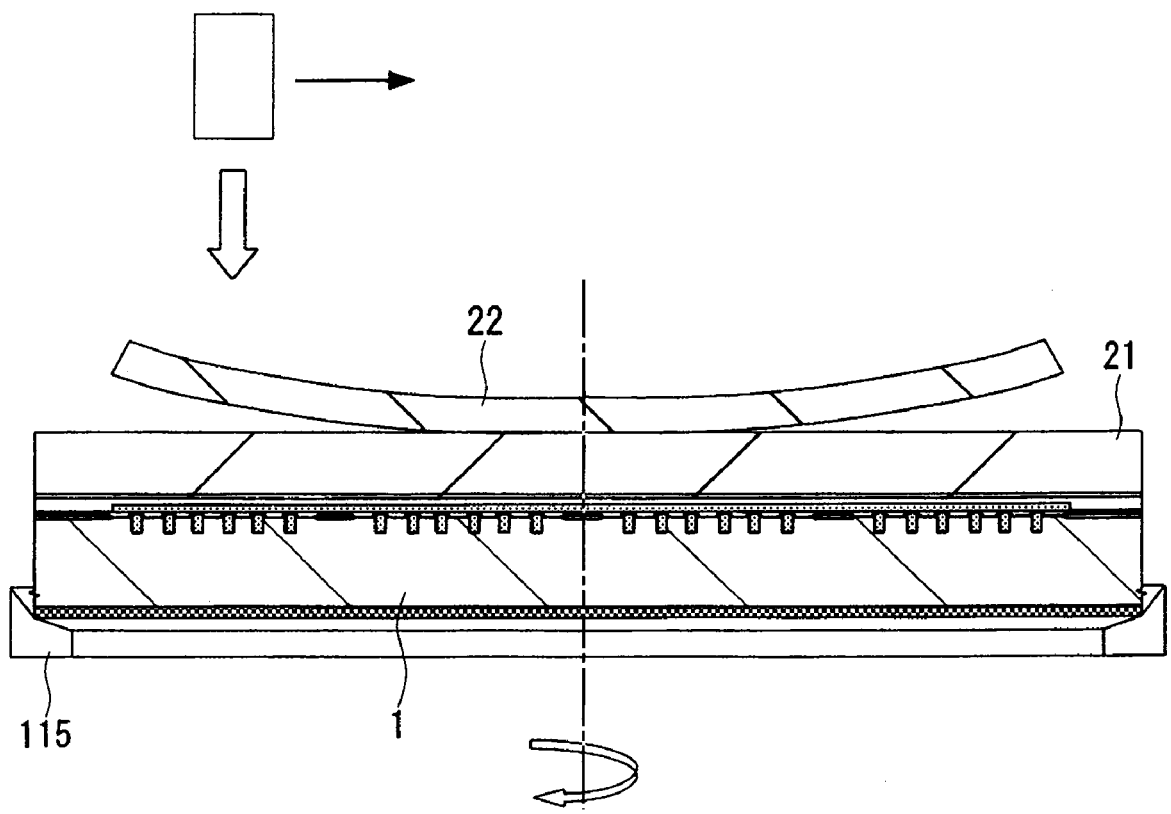
FIG. 17 is an explanatory view of a protective tape peeling method employed for the manufacture of the semiconductor device according to Embodiment 1 of the invention.

FIG. 17 is an explanatory view of a protective tape peeling method to be employed for the manufacture of a semiconductor device. The substrate 1 is fixed to a stage 115 (hot plate)

equipped with a rolling mechanism. The BG tape 22 having a hot foaming property peels by itself when the temperature of the stage 115 is elevated. As another method facilitating peeling, a material which peels by exposure to ultraviolet rays may be used as a material of the BG tape 22 instead.

The backside of the substrate 1 is then washed with hydrofluoric acid and ammonia to remove the distortion and foreign matters, which have appeared upon grinding, from the backside of the substrate 1 (STEP P08 of FIG. 1).

Figure 18:
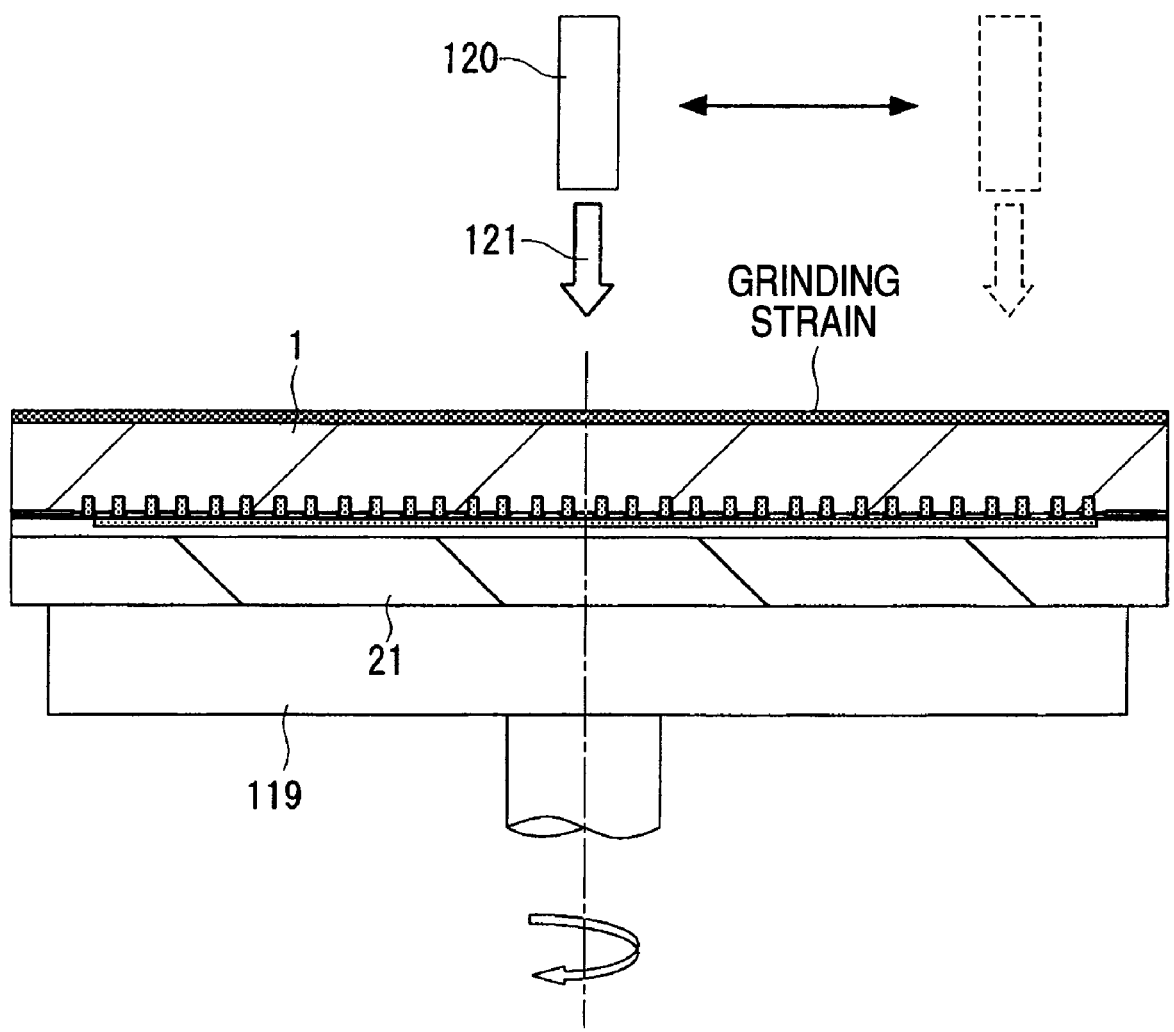
FIG. 18 is an explanatory view of a wet etching method employed for the manufacture of the semiconductor device according to Embodiment 1 of the invention.

FIG. 18 is an explanatory view of a wet etching method to be employed for the manufacture of a semiconductor device. The substrate 1 is fixed mechanically or by vacuum adsorption to a spin head 119 having a rolling mechanism. Then, an etchant 121 is poured onto the backside of the substrate 1 from a nozzle 120 disposed above the substrate 1 while turning the substrate 1, whereby the distortion and foreign matters on the backside of the substrate 1 are removed.

Figure 19:
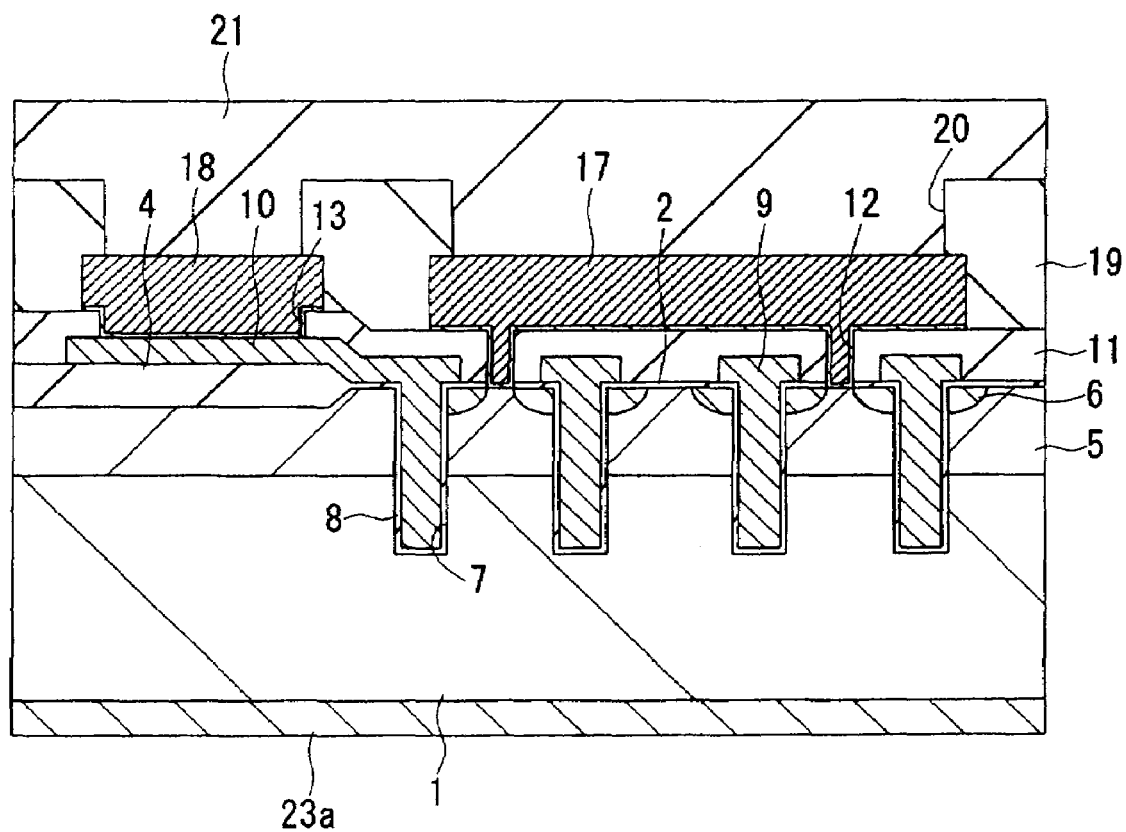
FIG. 19 is a fragmentary cross-sectional view illustrating the semiconductor device during its manufacturing step following that of FIG. 16.

As illustrated in FIG. 19, an impurity (for example, phosphorus) having n type conductivity is ion-implanted into the backside of the substrate 1 to form an ion implantation region 23a (Step P09 of FIG. 1). The phosphorus is ion implanted, for example, at the implant energy of from about 200 to 2000 keV with a dose of from about $10^{12}$ to $10^{13}$ cm$^{-2}$.

Figure 20:
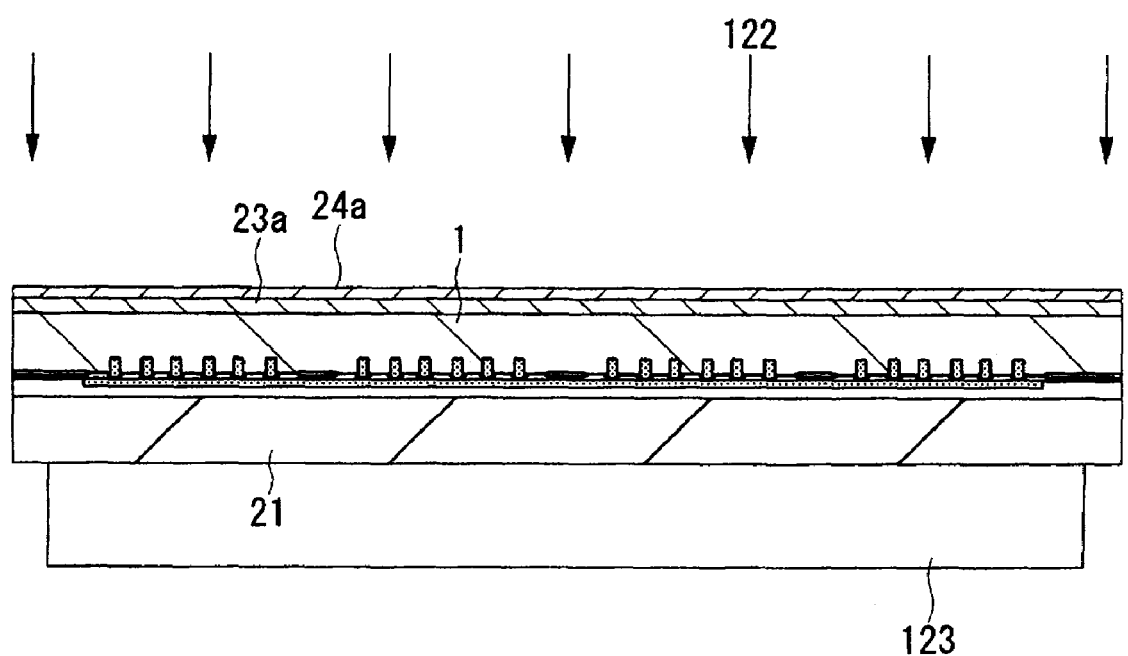
FIG. 20 is an explanatory view of an ion implantation method employed for the manufacture of the semiconductor device according to Embodiment 1 of the invention.

FIG. 20 is an explanatory view of an ion implantation method to be used for the manufacture of a semiconductor device. First, an impurity to be added is ionized by the discharge in an arc chamber. The ionized impurity (which will hereinafter be called "impurity ion") 122 is accelerated by an electric field and then an ion species and charge species are selected by a mass spectrometer. The impurity ion 122 thus selected is accelerated further and implanted into the backside of the substrate 1 fixed to a stage 123.

Upon ion implantation, since the substrate 1 is reinforced by the supporting substrate 21, cracks of the substrate 1 can be prevented. In addition, the ion implantation is performed after removal of the foreign material bonded to the BG tape 22 by peeling off the BG tape 22 in the previous step (Step P07 of FIG. 1) so that adhesion of the foreign material to the substrate 1 can be prevented.

Figure 21:
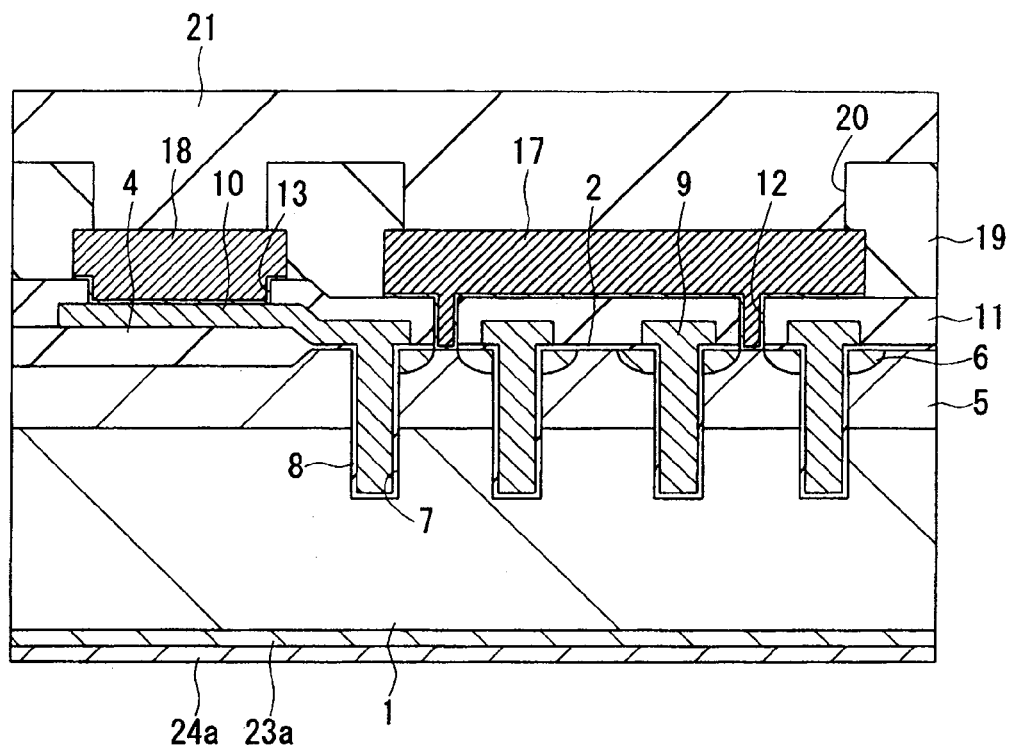
FIG. 21 is a fragmentary cross-sectional view illustrating the semiconductor device during its manufacturing step following that of FIG. 19.

As illustrated in FIG. 21, an impurity (for example, boron) of p type conductivity is ion implanted into a region shallower than the ion implantation region 23a on the backside of the substrate 1 to form an ion implantation region 24a (Step P10 of FIG. 1). Boron is ion-implanted at the implant energy of from about 30 to 60 keV with a dose of from about $10^{15}$ to $10^{16}$ cm$^{-2}$.

Figure 22:
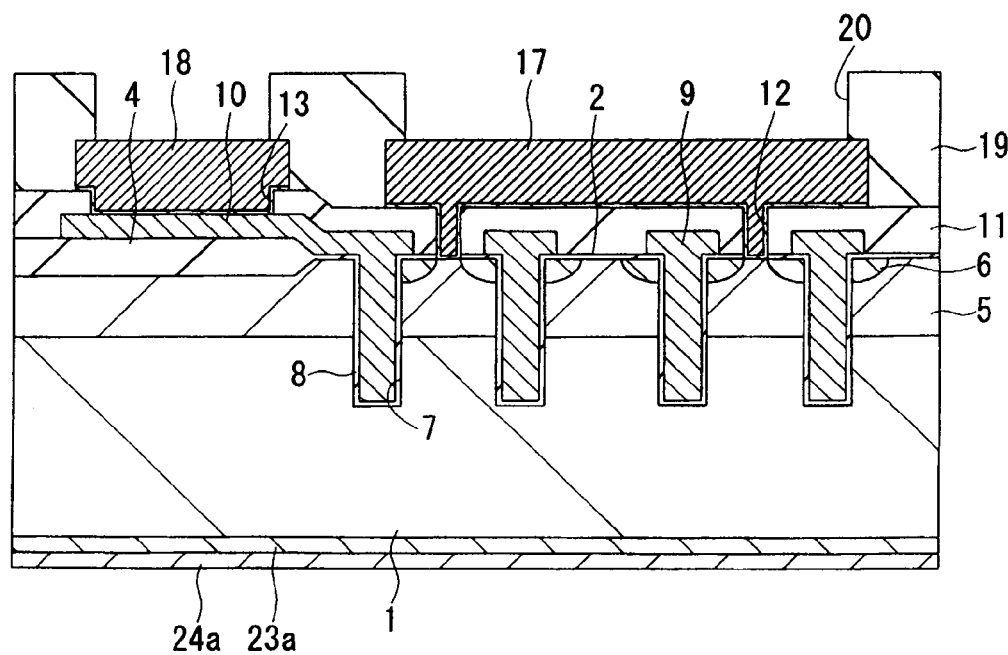
FIG. 22 is a fragmentary cross-sectional view illustrating the semiconductor device during its manufacturing step following that of FIG. 21.
Figure 23:
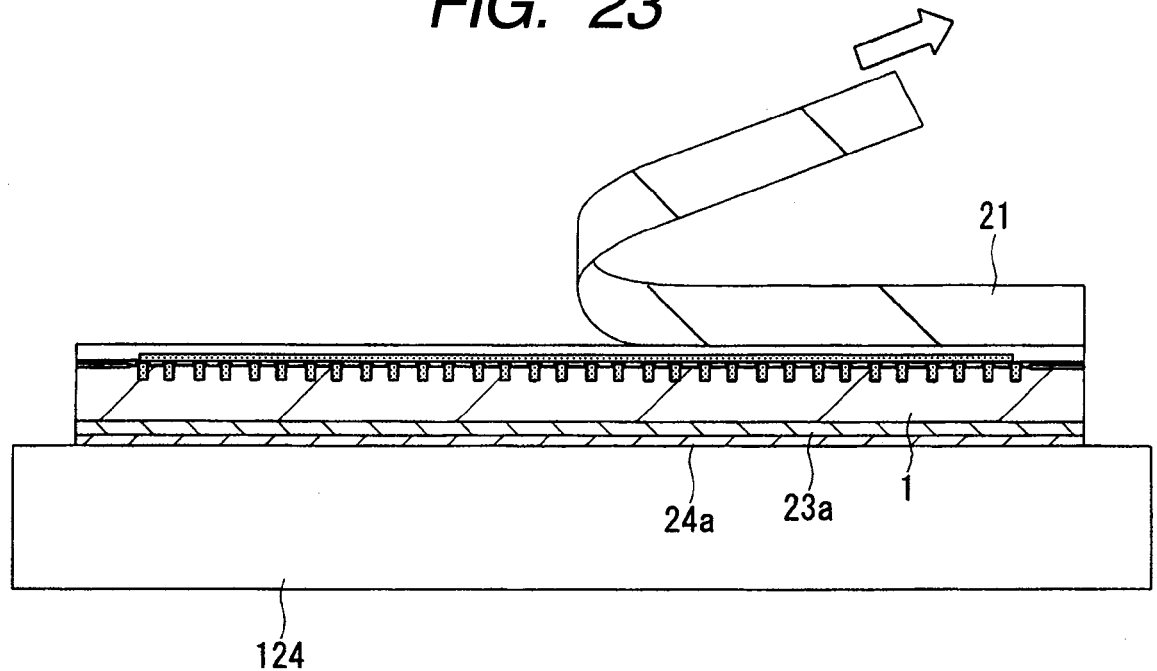
FIG. 23 is an explanatory view of a peeling method of a supporting substrate employed for the manufacture of the semiconductor device according to Embodiment 1 of the invention.

As illustrated in FIG. 22, the supporting substrate 21 is peeled off from the surface side of the substrate 1 (Step P11 of FIG. 1). FIG. 23 is an explanatory view of a supporting substrate peeling method to be employed for the manufacture of a semiconductor device. The substrate 1 is fixed to a porous stage 124 by vacuum adsorption and the supporting substrate 21 is peeled off from the surface side of the substrate 1.

Figure 24:
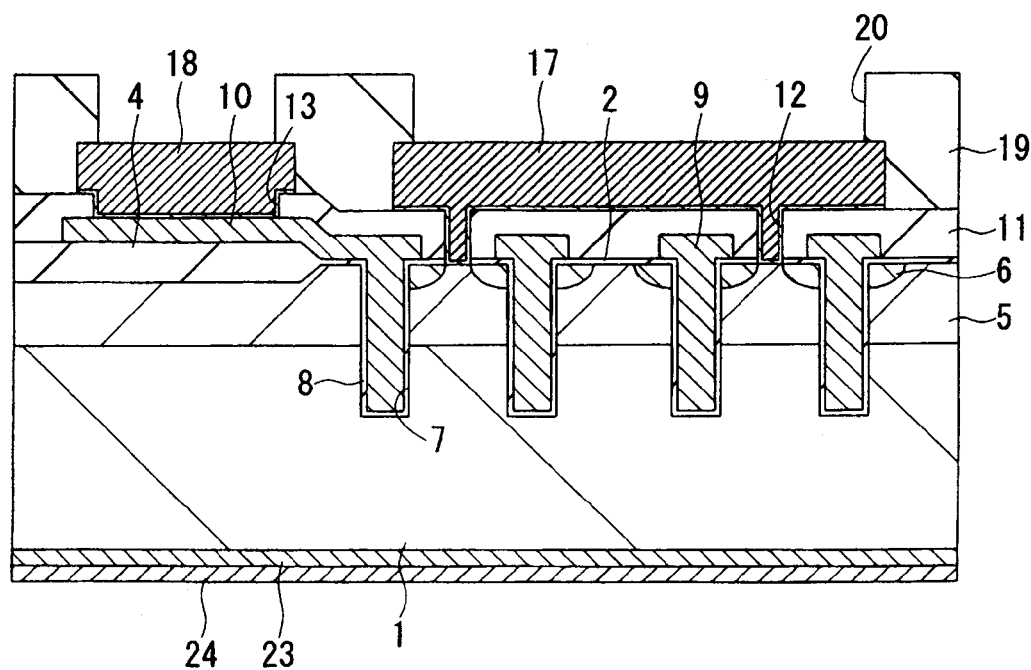
FIG. 24 is a fragmentary cross-sectional view illustrating the semiconductor device during its manufacturing step following that of FIG. 22.

As illustrated in FIG. 24, the surface side and backside of the substrate 1 are washed with an organic solvent to remove an organic matter (Step P12 of FIG. 1). Then, the substrate 1 is subjected to heat treatment at about 420° C. to activate the impurity ion-implanted into the backside of the substrate 1 to form an n$^+$ type semiconductor region 23 and a p$^+$ type semiconductor region 24 (Step P13 of FIG. 1). The p$^+$ type semiconductor region 24 forms a collector region and it is the bottommost layer of the substrate 1.

Figure 25:
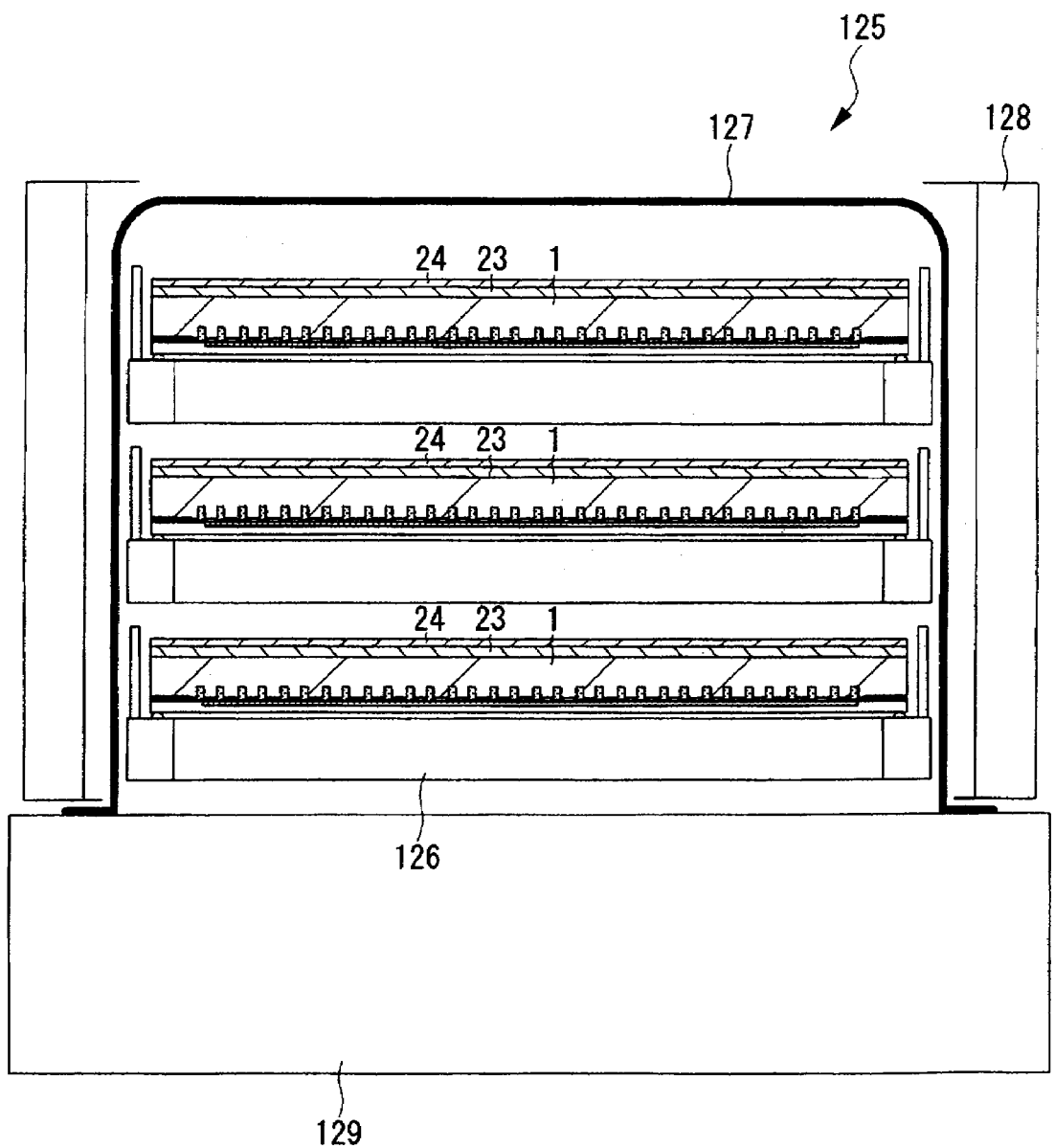
FIG. 25 is an explanatory view of a heat treating method employed for the manufacture of the semiconductor device according to Embodiment 1 of the invention.

FIG. 25 is an explanatory view of a heat treating method to be employed for the manufacture of a semiconductor device. The heat treatment is performed, for example, in a diffusion furnace 125. A plurality of the substrates 1 (three substrates 1 are illustrated in FIG. 25, but the number of the substrates 1 is not limited thereto) each placed on a stage 126 are located in a quartz tube 127. For the heating in the diffusion furnace 125, a cylindrical heater 128 having a resistance wire wound around the quartz tube 127 is used. The quartz tube 127 and cylindrical heater 128 are placed on a base plate 129.

Heat treatment at about 800° C. or greater is necessary for activating the impurity ion implanted into the substrate 1. In Embodiment 1, however, the heat treatment temperature is determined depending on the heat resistance temperature of the polyimide resin film 19 which is formed in Embodiment 1. When heat treatment is conducted at 420° C., that is, the upper limit of the heat resistance temperature of the polyimide resin film 19, the activation ratio of the impurity ion is below 10%.

Figure 26:
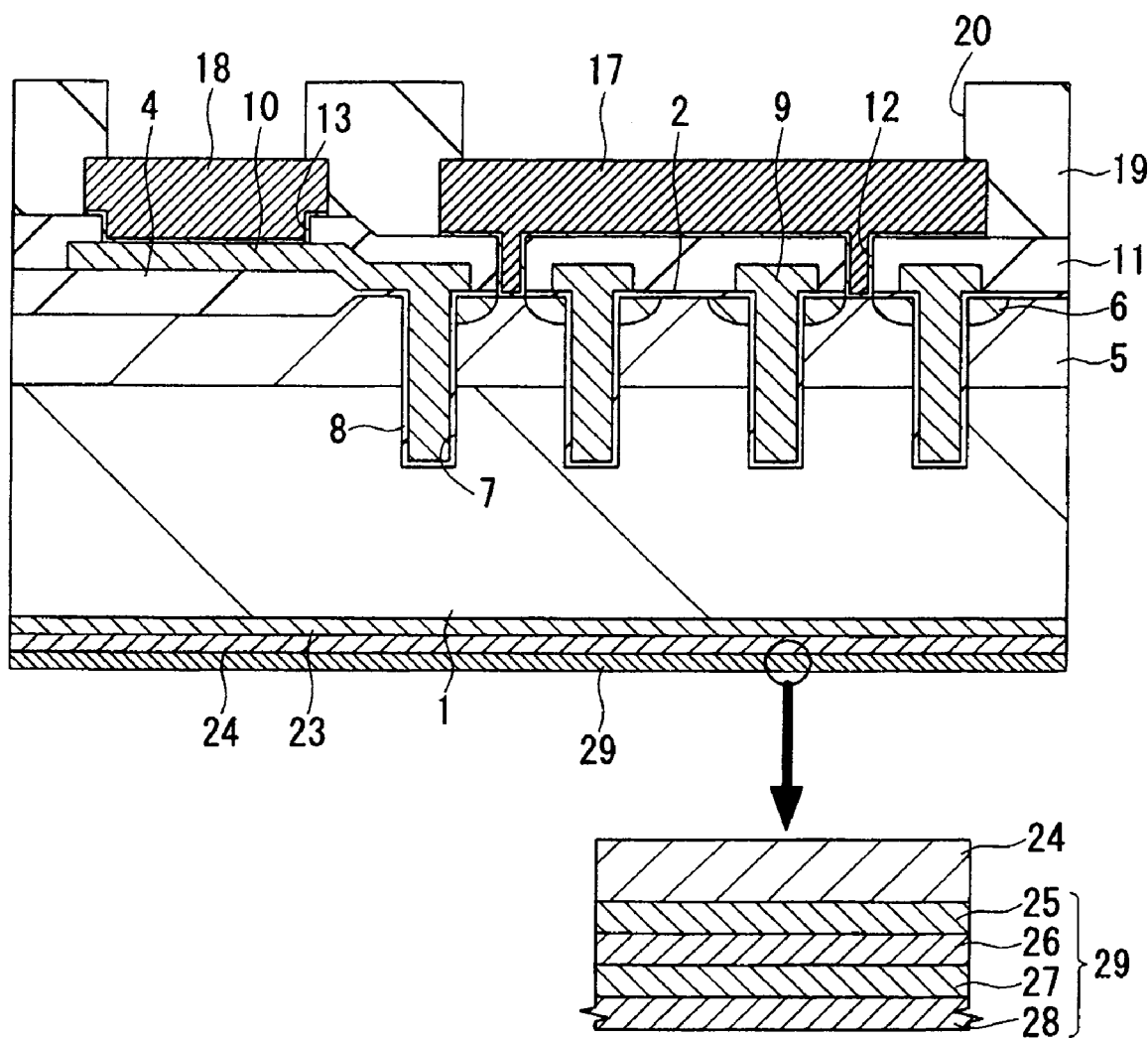
FIG. 26 is a fragmentary cross-sectional view illustrating the semiconductor device during its manufacturing step following that of FIG. 24.

As illustrated in FIG. 26, after washing the surface side and backside of the substrate 1 with hydrofluoric acid (Step P14 of FIG. 1), conductive films such as nickel (Ni) film 25, titanium (Ti) film 26, nickel film 27 and gold (Au) film 28 are formed successively by sputtering or vacuum deposition as a film stack (Step P15 of FIG. 1). The nickel film 25 has a thickness of about 100 μm, the titanium film 26 has a thickness of about 100 nm, the nickel film 27 has a thickness of about 600 nm, and the gold film 28 has a thickness of about 100 nm. This film stack will be a collector electrode (first metal film) 29 which is an extraction electrode of the collector region. The nickel film 25 and titanium film 26 may be replaced with an aluminum (Al) film.

Figure 27:
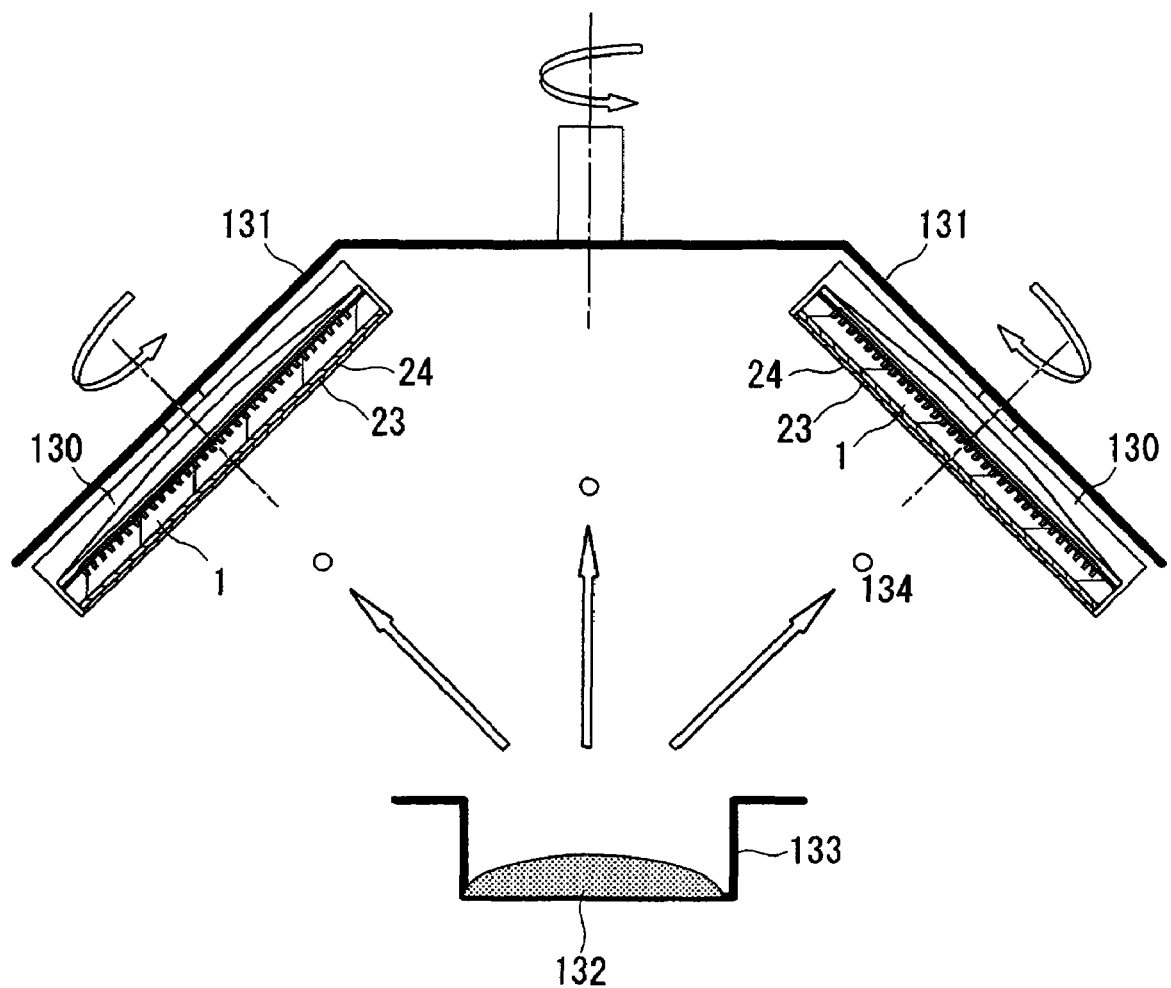
FIG. 27 is an explanatory view of a metal film forming method employed for the manufacture of the semiconductor device according to Embodiment 1 of the invention.

FIG. 27 is an explanatory view of a metal film forming method to be employed for the manufacture of a semiconductor device. Nickel is used as a material of the metal film. The substrate 1 is placed on wafer holders 130 rotating on their axis. These wafer holders 130 are fixed to a wafer holder set plate 131 which rotate these holders while rotating on its axis. A nickel film is formed on the backside of the substrate 1 by heating a crucible 133 containing a nickel evaporation source 132 therein to vaporize nickel particles 134 while rotating the wafer holders 130 and wafer holder set plate 131.

Alloy treatment is then performed. The nickel film 25 is reacted with the substrate (single crystal silicon) 1 to form a compound with which an ohmic contact is attained (Step P16 of FIG. 1).

Figure 28:
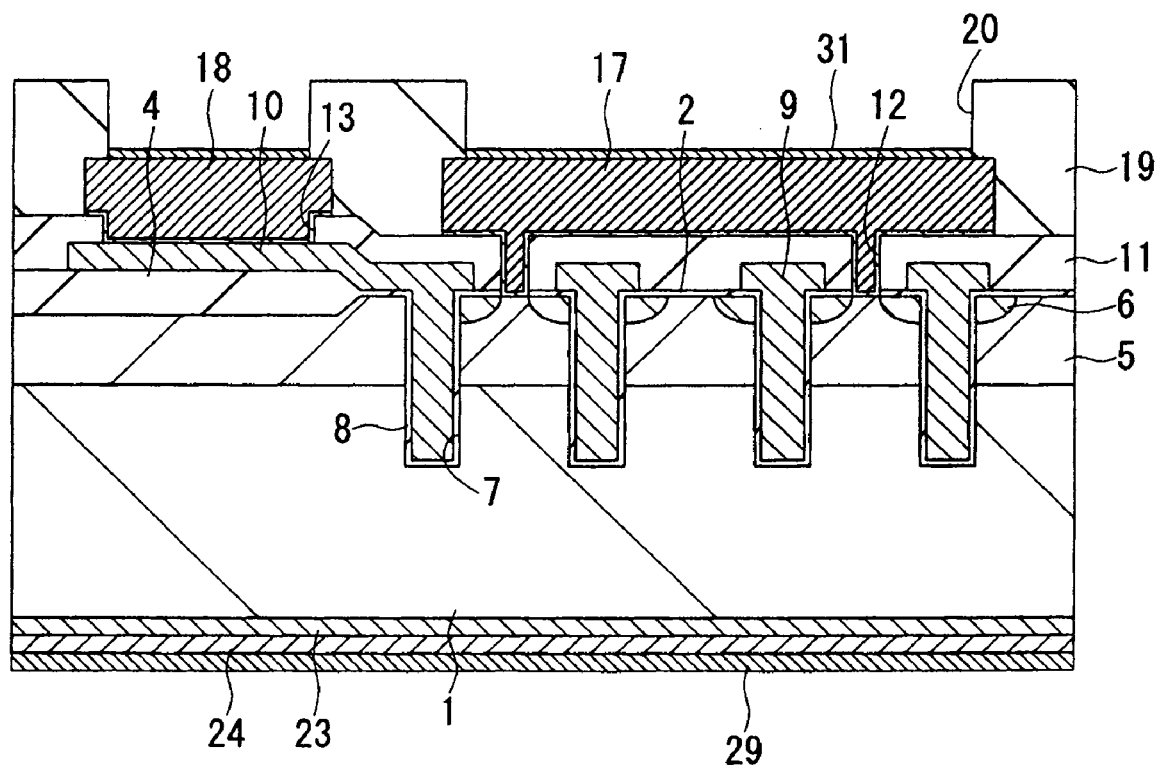
FIG. 28 is a fragmentary cross-sectional view illustrating the semiconductor device during its manufacturing step following that of FIG. 26.

As illustrated in FIG. 28, a thin conductive film (second metal film) 31 is formed over the surfaces of the interconnects 17 and 18 which have appeared from the bottoms of the openings 20 (Step P17 of FIG. 1). As an example of the conductive film 31, a film stack obtained by successively stacking a nickel film and a gold film one after another can be given. The thickness of the nickel film is about 4 μm, while that of the gold film is about 80 nm. The conductive film 31 will be a bump underlying film of a bump electrode which will be formed in a later step.

Figure 29:
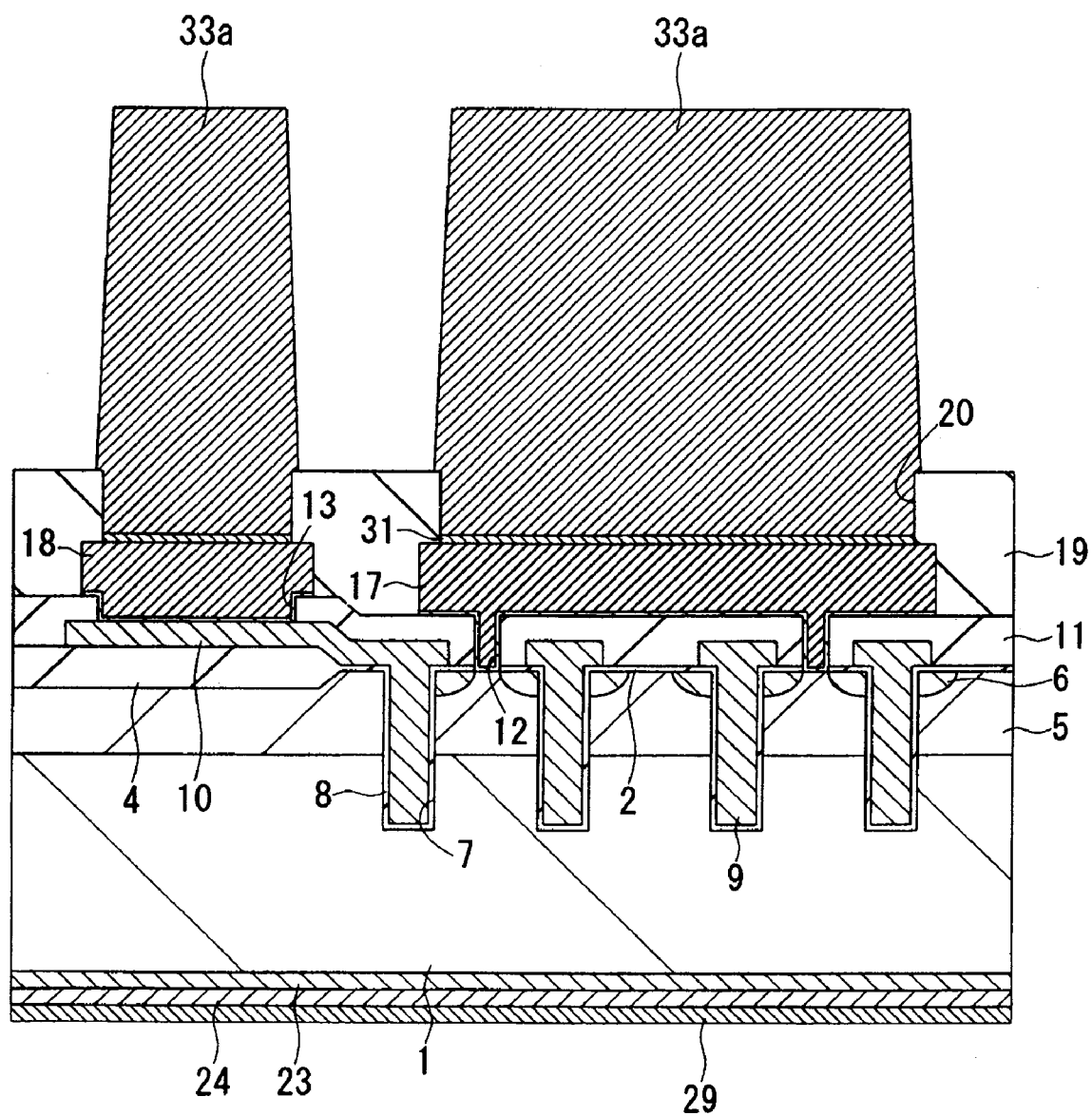
FIG. 29 is a fragmentary cross-sectional view illustrating the semiconductor device during its manufacturing step following that of FIG. 28.
Figure 30:
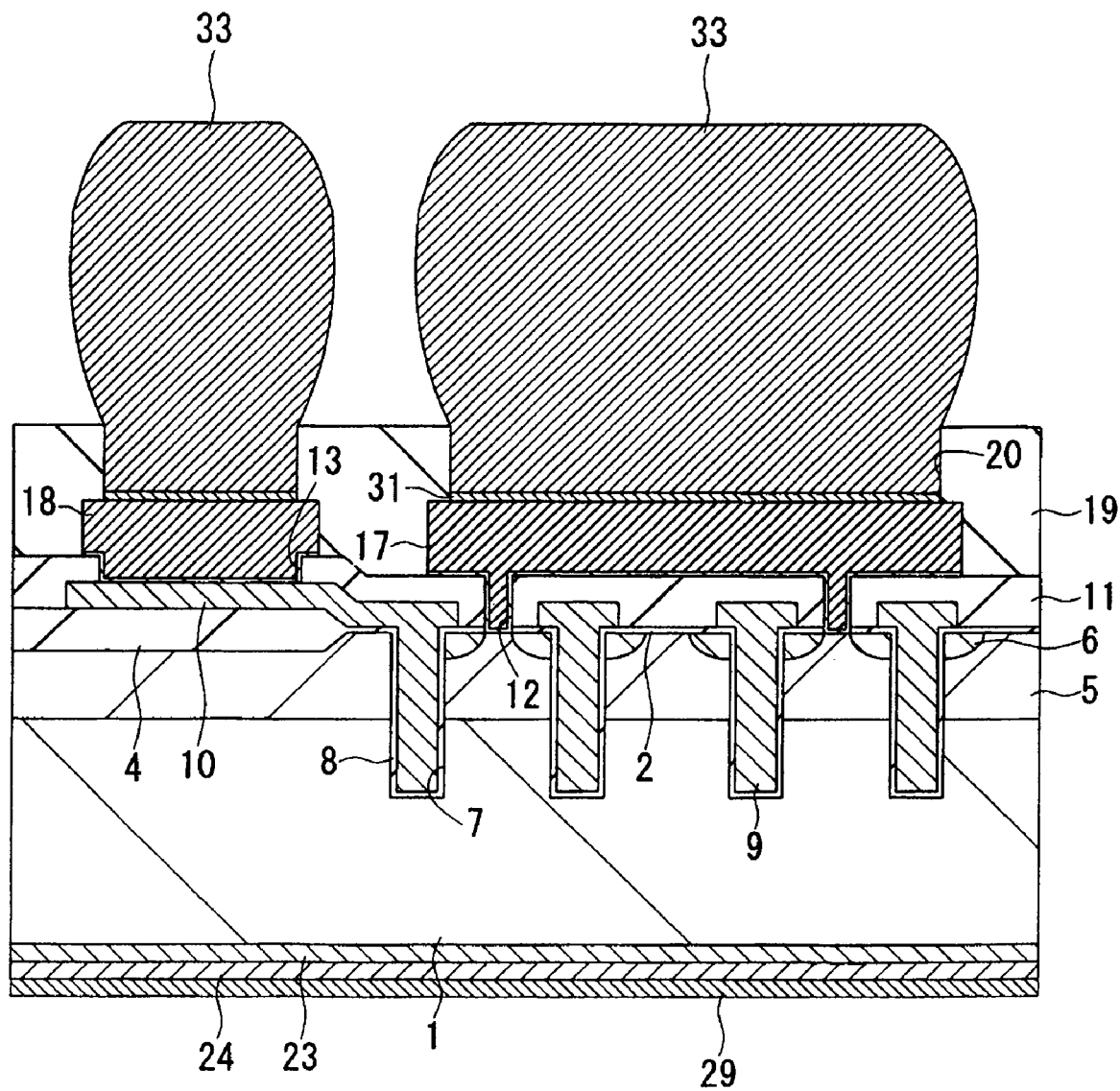
FIG. 30 is a fragmentary cross-sectional view illustrating the semiconductor device during its manufacturing step following that of FIG. 29.

As illustrated in FIG. 29, with a metal mask patterned in accordance with the planar pattern of the openings 20, a solder paste 33 made of, for example, silver (Ag), tin (Sn) and copper (Cu) is printed to fill the openings 20 therewith. As illustrated in FIG. 30, by the reflow treatment, bump electrodes 33 of about 150 μm thick electrically connected to the interconnects 17 and 18 are formed (Step P18 of FIG. 1). The bump electrode 33 and interconnect 17 will be an emitter electrode electrically connected to the n$^+$ type semiconductor region 6 which will be an emitter region of the IGBT. The substrate 1 in the wafer form is then diced, for example, along dicing regions and separated into individual semiconductor chips SC.

Figure 31:
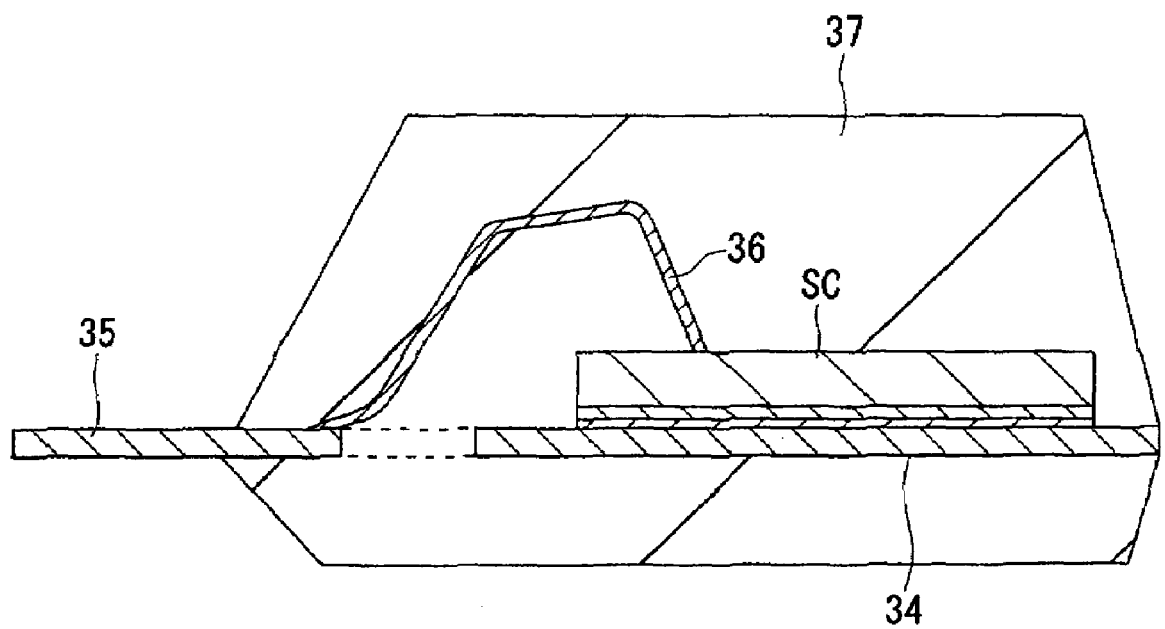
FIG. 31 is a fragmentary cross-sectional view illustrating the semiconductor device during its manufacturing step following that of FIG. 30.

As illustrated in FIG. 31, the semiconductor chip SC is fixed onto, for example, a lead frame 34. The pad portion on the surface of the semiconductor chip SC is connected to a lead 35 with a gold wire 36. The lead frame 34 is then sandwiched between gold molds or the like and a molten resin is poured inside of the gold molds. By curing the resin, the semiconductor chip SC and gold wire 36 are sealed at the surroundings thereof with a resin 37. The lead protruding from the resin 37 is then put into a desired shape if necessary, whereby the manufacture of a semiconductor device is completed.

According to Embodiment 1, the surface side of the substrate 1 is protected with a two-layer protective tape composed of the supporting substrate 21 and BG tape 22. After thinning of the substrate 1 by grinding it from the backside, foreign materials such as silicon dust attached onto the surface of the BG tape 22 are removed by peeling off the BG tape 22, whereby adhesion of the foreign materials to the backside of the substrate 1 can be prevented. Moreover, this makes it possible to prevent generation of defects in the collector region ($p^+$ type semiconductor region 24) which is formed on the back side of the substrate 1 by ion implantation of an impurity and heat treatment, which leads to an improvement in the production yield of the semiconductor device. Moreover, upon ion implantation, the substrate 1 is free from cracks, because it is reinforced by the supporting substrate 21.

Embodiment 2

In Embodiment 1, after formation of a protective film (polyimide resin film 19) which is the uppermost layer formed on the surface side of the substrate 1, the backside of the substrate 1 is ground and a collector region ($p^+$ type semiconductor region 24) is formed on the backside of the substrate 1 by ion implantation. Alternatively, a protective film may be formed after the formation of the collector region by ion implantation.

Figure 32:
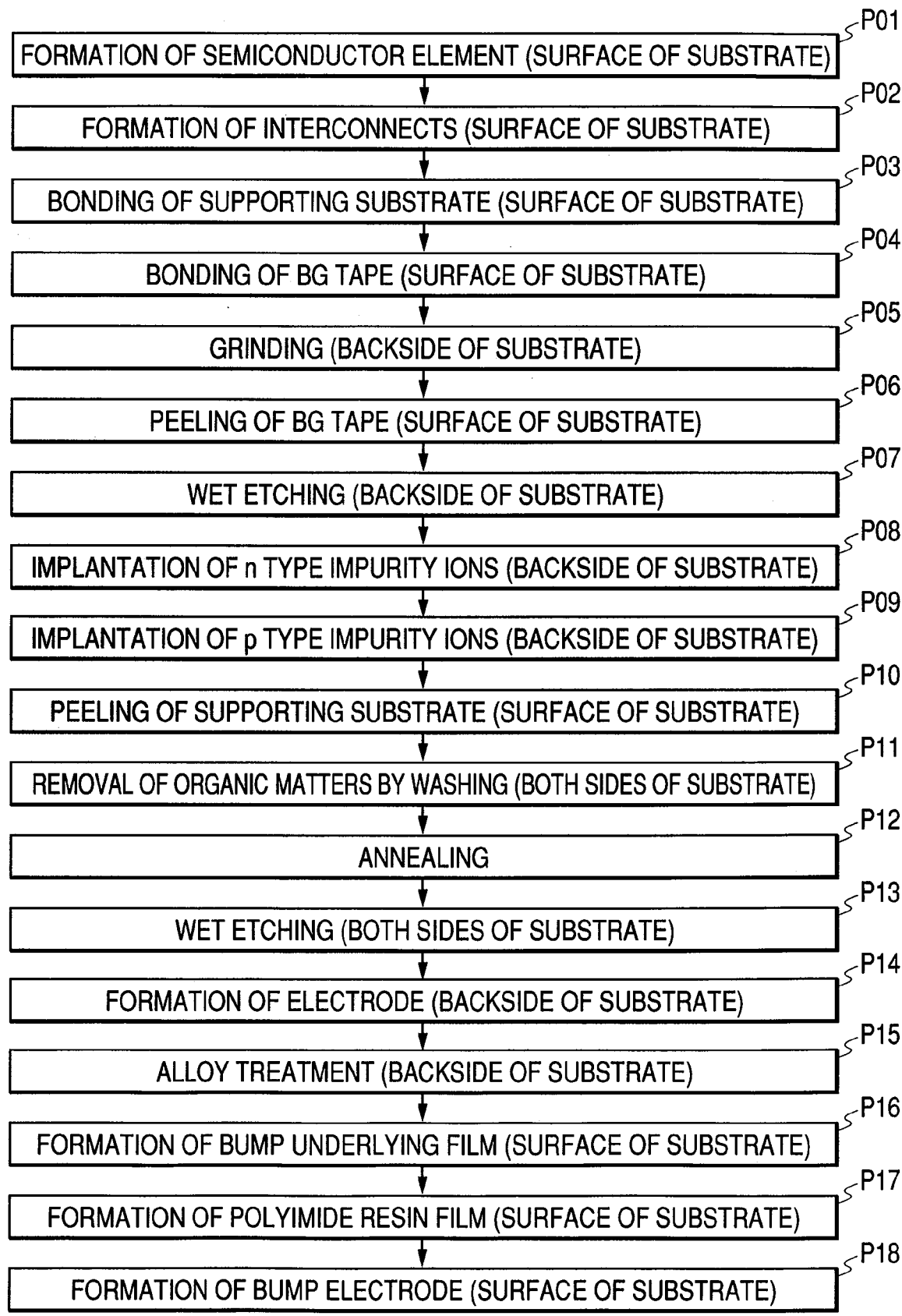
FIG. 32 is a flow chart explaining a manufacturing method of a semiconductor device according to Embodiment 2 of the invention.

The semiconductor device of Embodiment 2 will next be described based on FIGS. 32 to 41. FIG. 32 is a flow chart of the manufacturing method of the semiconductor device of Embodiment 2. Steps up to the formation of interconnects made of a conductive film are similar to those shown in FIGS. 2 to 8 in Embodiment 1 (Step P01 to Step P02 of FIG. 1) so that description on them is omitted and only the steps subsequent to them will next be described.

Figure 33:
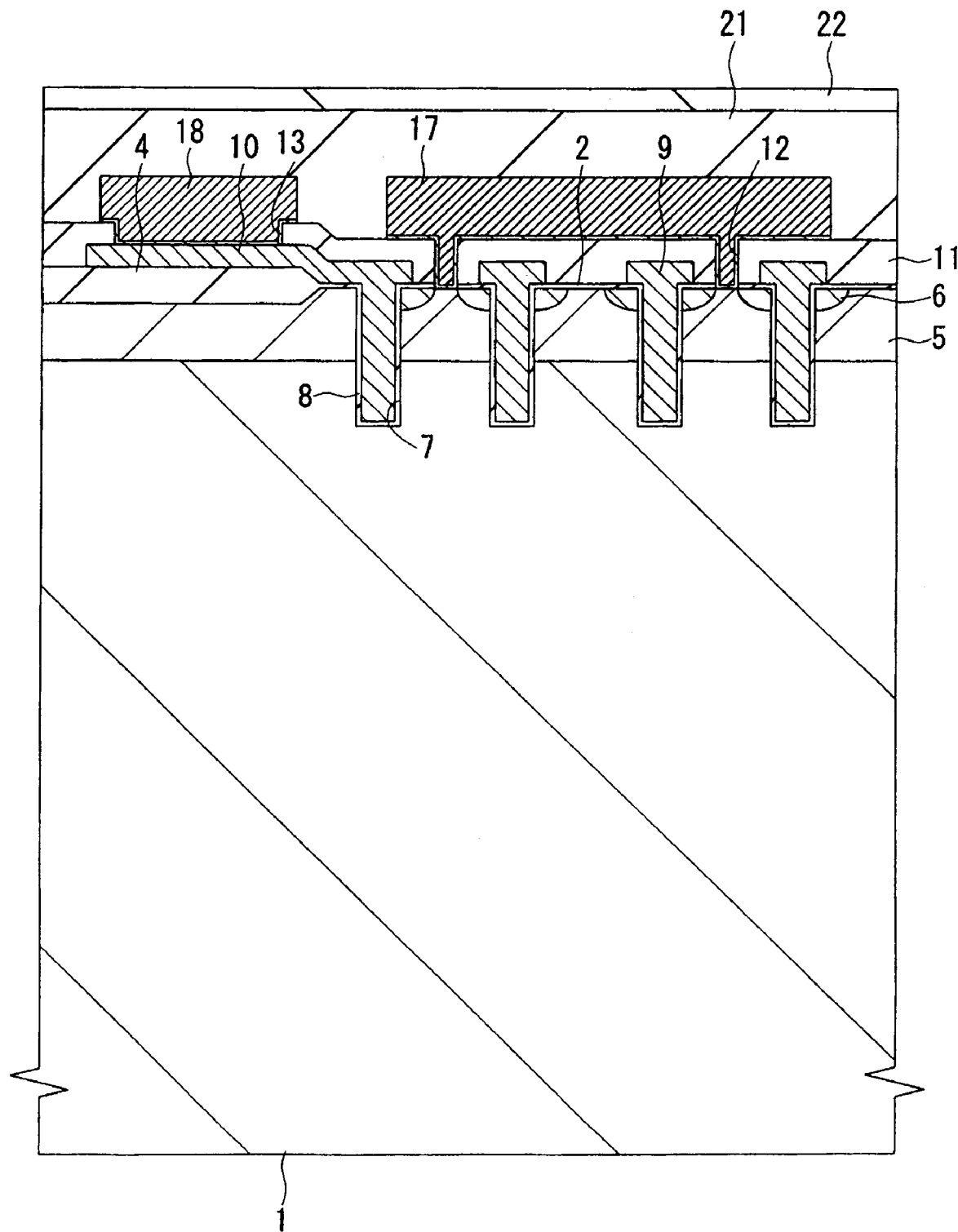
FIG. 33 is a fragmentary cross-sectional view explaining the manufacturing method of the semiconductor device according to Embodiment 2 of the invention.

Following Step P02 (FIG. 1) of Embodiment 1, as illustrated in FIG. 33, a supporting substrate 21 is adhered onto interconnects 17 and 18 and then, a BG tape 22 is adhered onto the supporting substrate 21, whereby the surface of the substrate 1 is protected by this two-layer protective film (Steps P03 and P04 of FIG. 32). The interconnects 17 and 18 are made of a conductive film and a barrier conductor film. An aluminum alloy film can be given as an example of the conductive film. Not only an aluminum alloy film, a tungsten (W) film or titanium film can be used instead as the conductive film 16.

Figure 34:
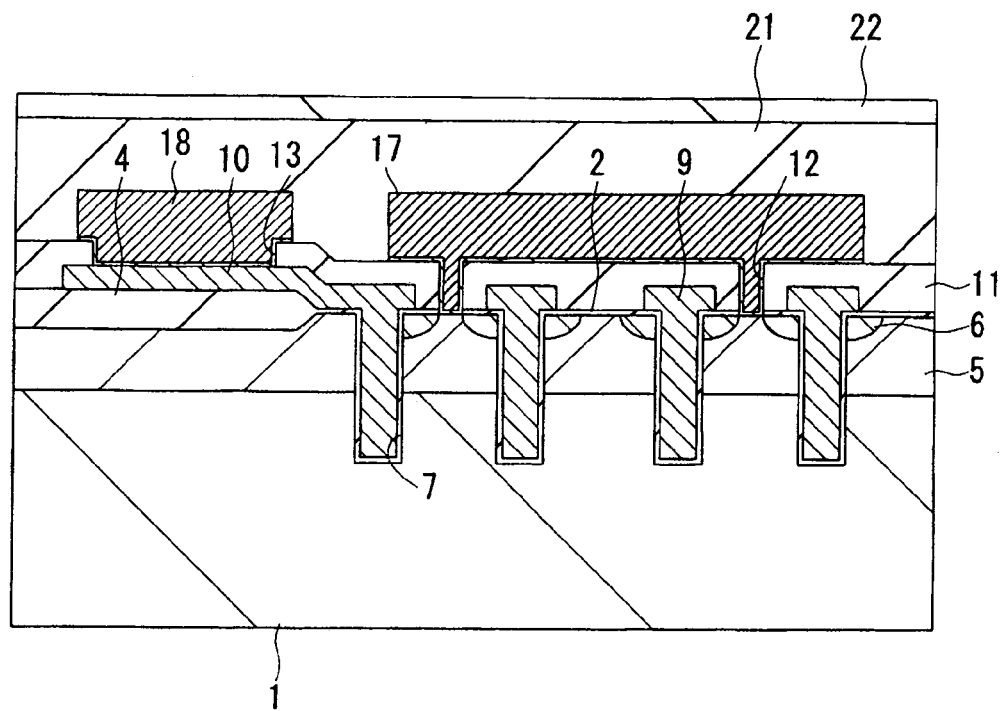
FIG. 34 is a fragmentary cross-sectional view illustrating the semiconductor device during its manufacturing step following that of FIG. 33.

As illustrated in FIG. 34, with the surface protected by the supporting substrate 21 and BG tape 22 down, the substrate 1 is ground from its backside and the substrate 1 is thinned to, for example, about 50 to 200 µm (Step P05 of FIG. 32), preferably 120 µm or less.

Figure 35:
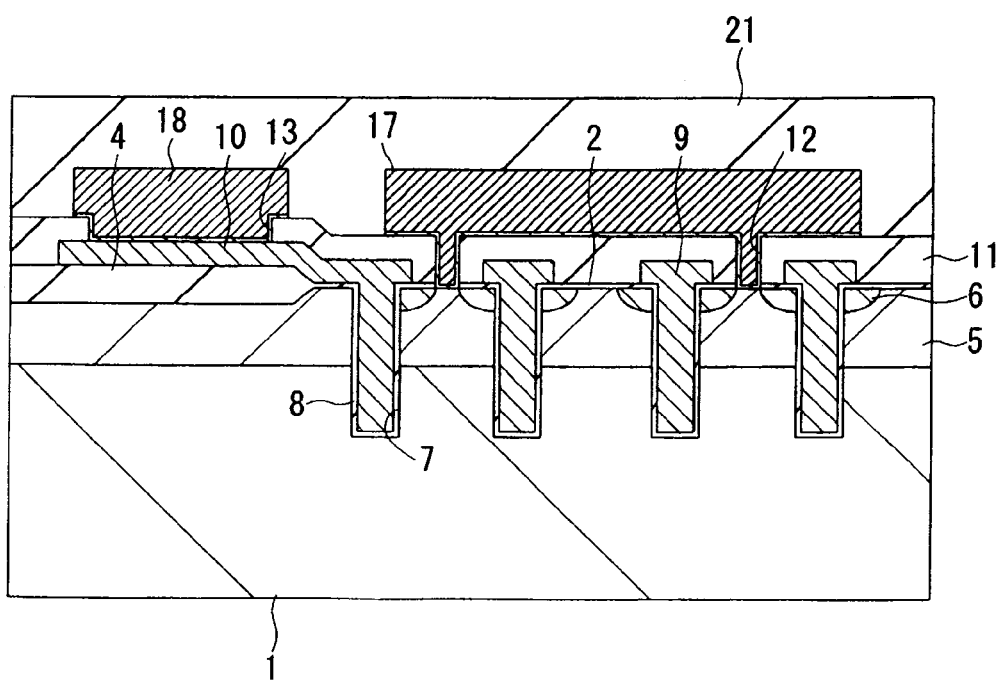
FIG. 35 is a fragmentary cross-sectional view illustrating the semiconductor device during its manufacturing step following that of FIG. 34.
Figure 36:
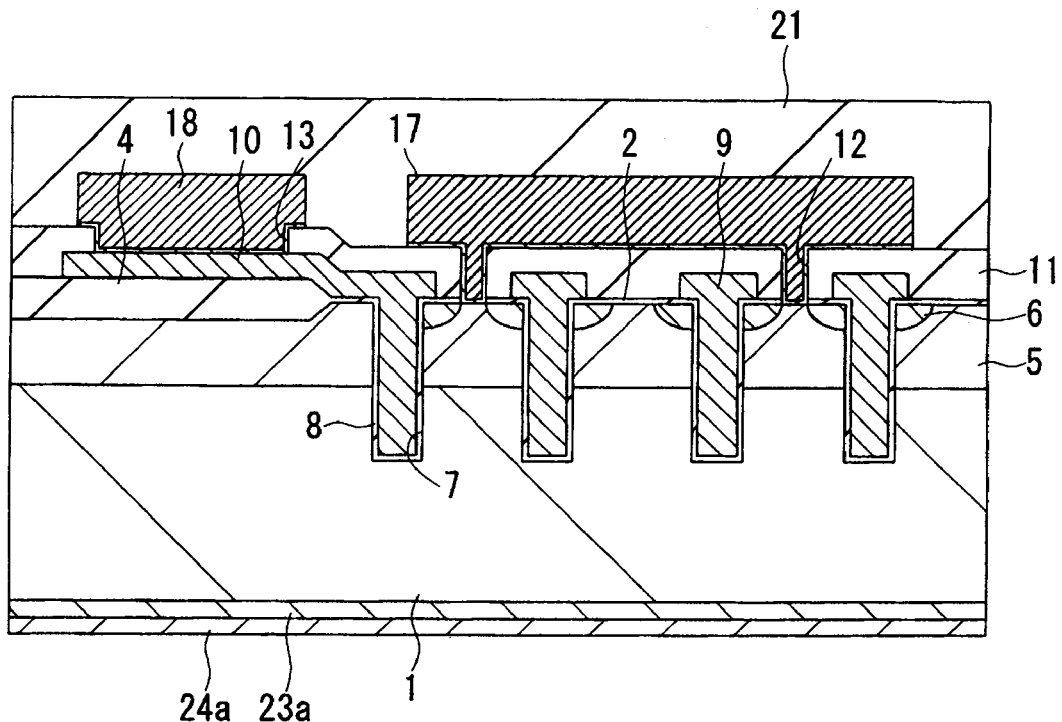
FIG. 36 is a fragmentary cross-sectional view illustrating the semiconductor device during its manufacturing step following that of FIG. 35.
Figure 37:
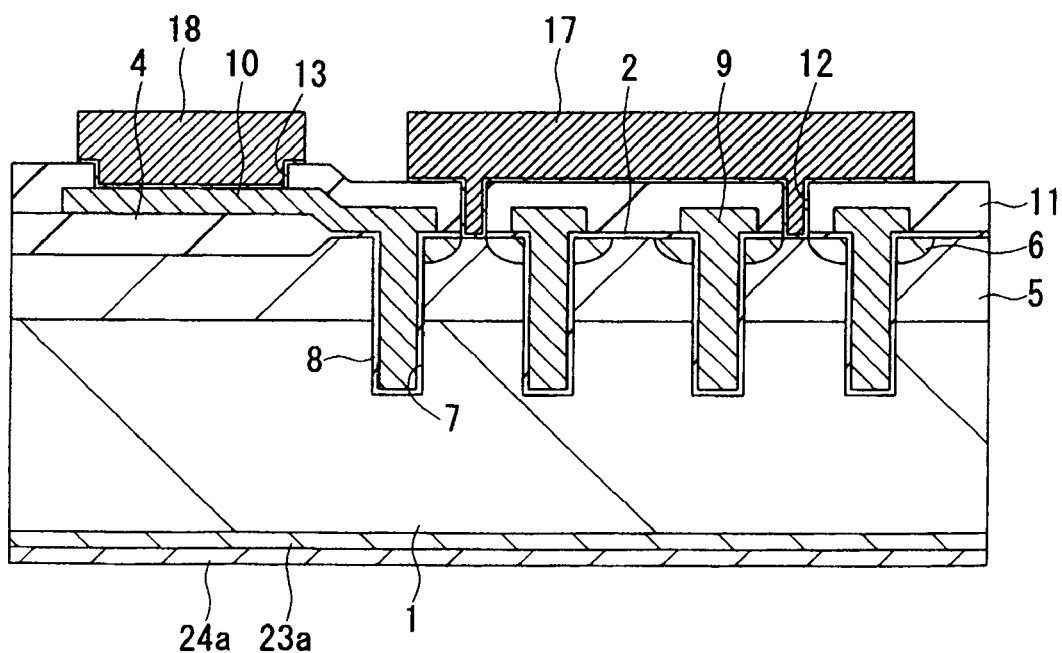
FIG. 37 is a fragmentary cross-sectional view illustrating the semiconductor device during its manufacturing step following that of FIG. 36.

As illustrated in FIG. 35, after peeling the BG tape 22 from the supporting substrate 21 (Step P06 of FIG. 32), the backside of the substrate is washed with hydrofluoric acid (Step P07 of FIG. 32). As illustrated in FIG. 36, an impurity (for example, phosphorus) having n type conductivity is ion-implanted into the backside of the substrate 1, whereby an ion implantation region 23a is formed (Step P08 of FIG. 32). An impurity (for example, boron) having p type conductivity is ion-implanted into the backside of the substrate 1 to form an ion implantation region 24a (Step P09 of FIG. 32). As illustrated in FIG. 37, the supporting substrate 21 is then peeled off from the surface side of the substrate 1 (Step P10 of FIG. 32).

Figure 38:
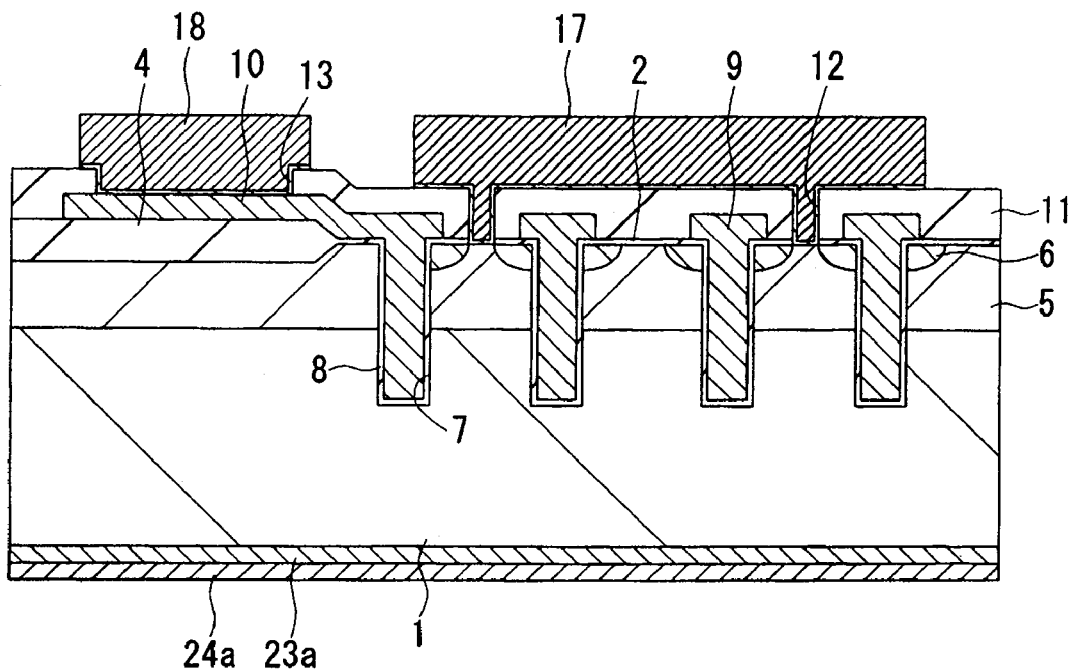
FIG. 38 is a fragmentary cross-sectional view illustrating the semiconductor device during its manufacturing step following that of FIG. 37.

As illustrated in FIG. 38, the surface side and backside of the substrate 1 are washed with an organic solvent. After removal of an organic matter (Step P11 of FIG. 32), the substrate is heat treated at about 500° C. to activate the impurity introduced into the backside of the substrate 1, whereby $n^+$ type semiconductor region 23 and $p^+$ type semiconductor region 24 are formed (Step P12 of FIG. 32). The $p^+$ type semiconductor region 24 forms a collector region.

In Embodiment 1, the heat treatment for activating the impurity ion is performed at a temperature determined, depending on the heat resistance of the polyimide resin film 19, for example, at 420° C. In Embodiment 2, on the other hand, no polyimide resin film has been formed yet so that the heat treatment temperature is determined, depending on the heat resistance temperature of a material other than the polyimide resin film. In Embodiment 2, the heat treatment temperature can be determined by the heat resistance temperature of aluminum constituting each of the interconnects 17 and 18. For example, when heat treatment is conducted at a temperature not causing deterioration of aluminum, for example, at 470° C., the activation ratio of the impurity ion ranges from 10 to 20%. When each of the interconnects 17 and 18 is made of tungsten or titanium film, the heat treatment temperature can be determined without depending on the heat resistance temperature of the interconnects 17 and 18. Heat treatment can be performed at a temperature not causing a change in the semiconductor structure thus manufactured, that is, not adversely affecting the properties of the semiconductor element, for example, at about 800° C. The activation ratio of the impurity can be raised to almost 100%.

Figure 39:
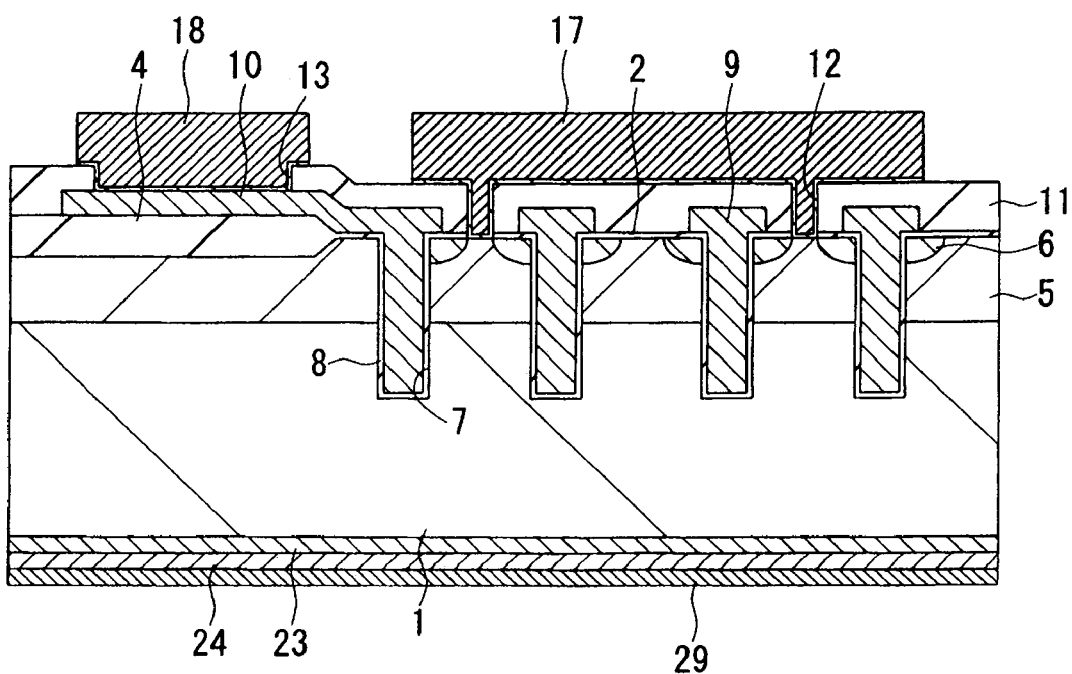
FIG. 39 is a fragmentary cross-sectional view illustrating the semiconductor device during its manufacturing step following that of FIG. 38.

As illustrated in FIG. 39, after washing with the surface side and backside of the substrate 1 with hydrofluoric acid (Step P13 of FIG. 32), a conductive film serving as an extraction electrode (collector electrode) 29 in a collector region is formed on the backside of the substrate 1 (Step P14 of FIG. 32).

Figure 40:
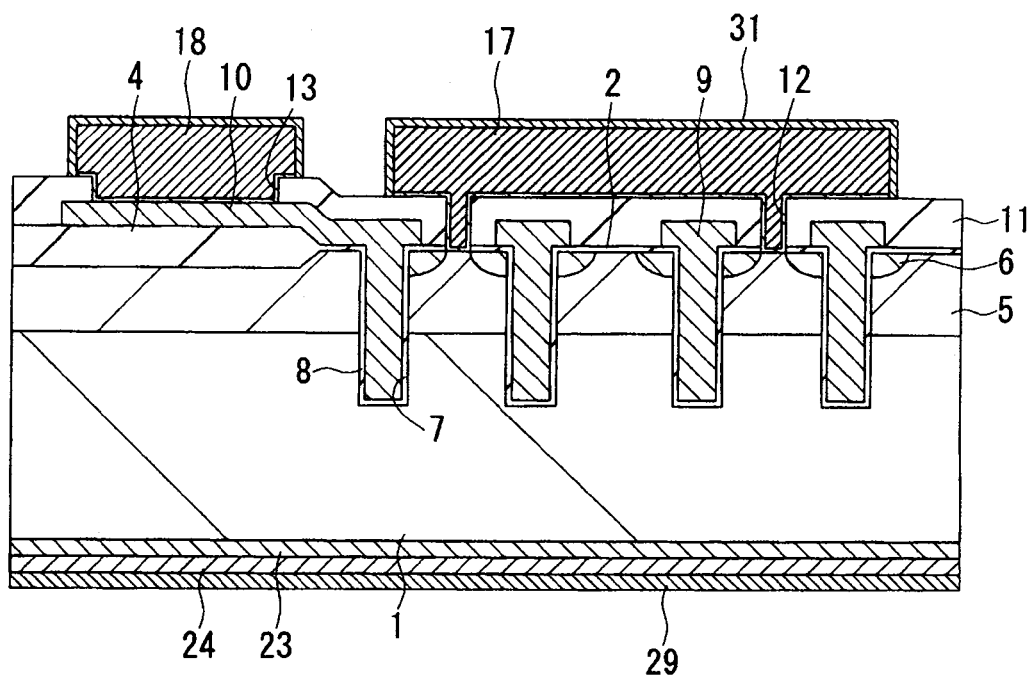
FIG. 40 is a fragmentary cross-sectional view illustrating the semiconductor device during its manufacturing step following that of FIG. 39.

After alloy treatment (Step P15 of FIG. 32), as illustrated in FIG. 40, a thin conductive film (bump underlying film) 31 is formed (Step P16 of FIG. 32) by electroplating on the surface of each of the interconnects 17 and 18 which have appeared from the bottom of the openings 20. By electroplating while exposing the polyimide resin film, a phenomenon called bridging, that is, a phenomenon of forming an unnecessary plating layer on the surface of the polyimide resin film sometimes occurs and this unnecessary plating layer becomes a cause of electric short-circuit failure. The polyimide resin film has not yet been formed at this stage so that such a phenomenon does not occur.

Figure 41:
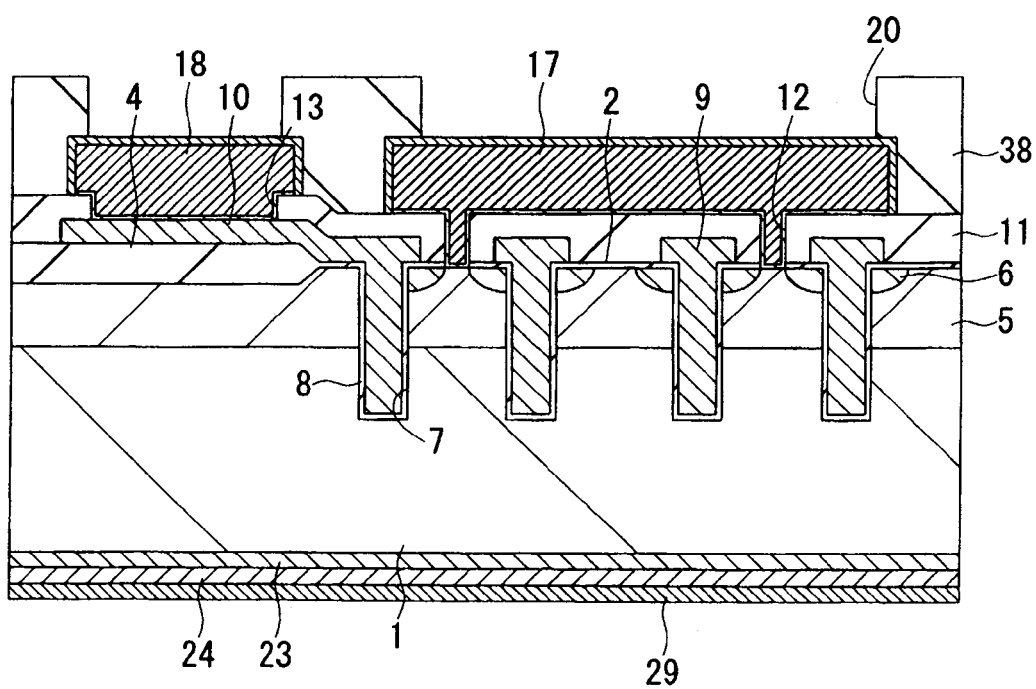
FIG. 41 is a fragmentary cross-sectional view illustrating the semiconductor device during its manufacturing step following that of FIG. 40.

As illustrated in FIG. 41, a polyimide resin film (protective film) 38 of about 10 µm thick is formed. Since the substrate 1 is thin and the method of application is not suited because of difficulty in carrying and supporting of it, the polyimide resin film 38 is formed by printing technology. The polyimide resin film 38 may be either photosensitive or non-photosensitive (Step P17 of FIG. 32).

Figure 42:
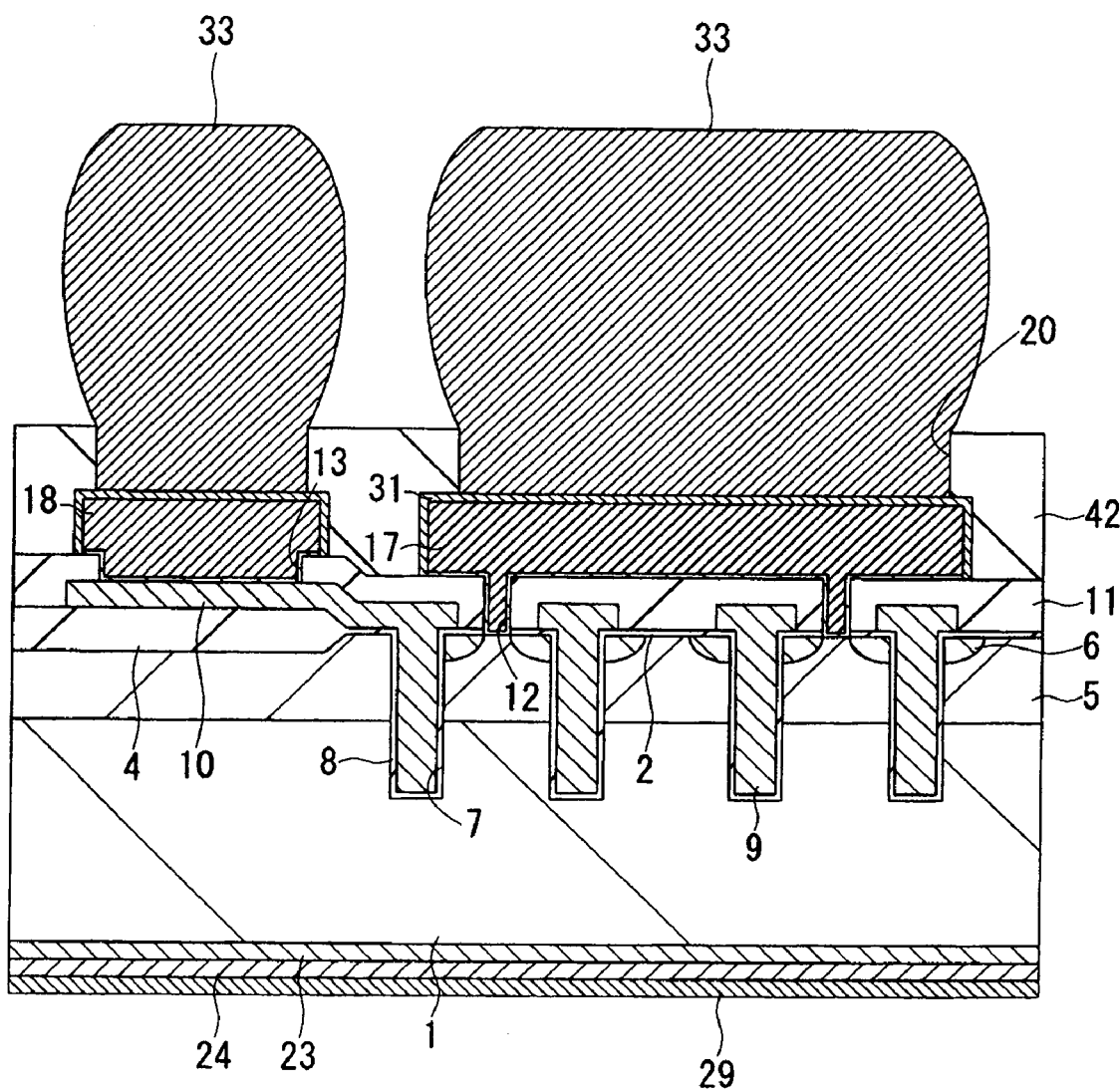
FIG. 42 is a fragmentary cross-sectional view illustrating the semiconductor device during its manufacturing step following that of FIG. 41.

As illustrated in FIG. 42, with a metal mask patterned in accordance with a planar pattern of the openings 20, a solder paste is printed and the openings 20 are filled therewith. By the reflow treatment, bump electrodes 33 electrically connected to the interconnects 17 and 18 are formed (Step P18 of FIG. 32). The substrate 1 in the wafer state is then diced along dicing regions and separated into individual semiconductor chips.

According to Embodiment 2, as described above, by forming the polyimide resin film 38 after implantation of an impurity ion into the backside of the substrate 1 and heat treatment, the heat treatment temperature is not controlled by the heat resistance temperature of the polyimide resin film 38, but determined by a temperature not causing a deterioration of a metal film constituting the interconnects 17 and 18. When the interconnects 17 and 18 are each made of aluminum, heat treatment can be performed at 500° C., whereby an activation ratio of the impurity ion can be adjusted to from 10 to 20%. Since the conductive film 31 is formed over the surface of the interconnects 17 and 18 by electroplating prior to the formation of the polyimide resin film 38, an unnecessary plating layer is not formed on the surface of the polyimide resin film 38 and an electric short-circuit failure due to unnecessary plating layer can be prevented.

Embodiment 3

In Embodiment 1, the collector electrode 29 is formed by sputtering or vacuum deposition and bump underlying films (conductive films 31) are formed over the surface of the interconnects 17 and 18 by electroplating. Thus, different methods are adopted for their formation, but the collector electrode and bump underlying film may be formed in one step.

Figure 43:
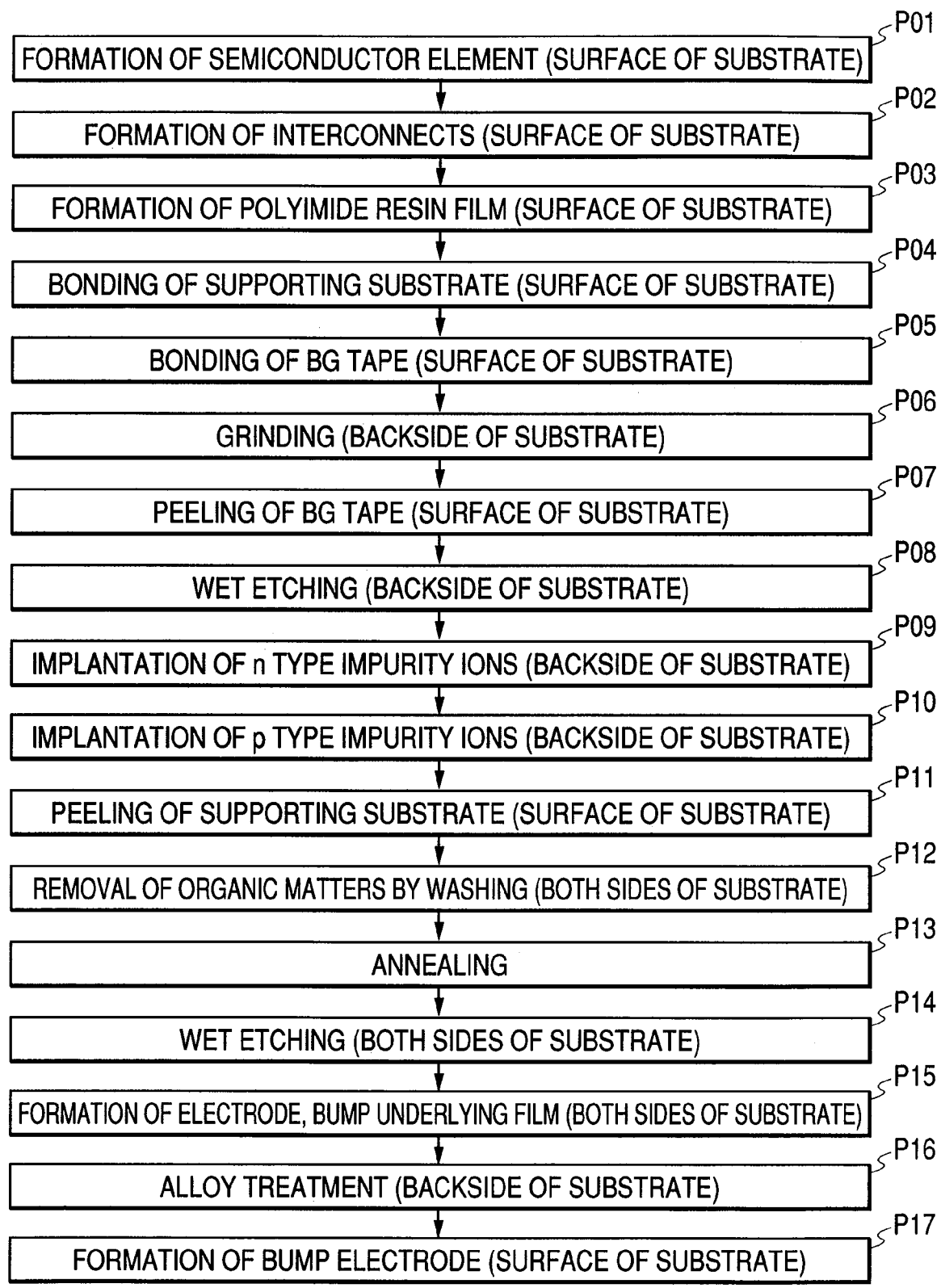
FIG. 43 is a flow chart explaining a manufacturing method of a semiconductor device according to Embodiment 3 of the invention.
Figure 44:
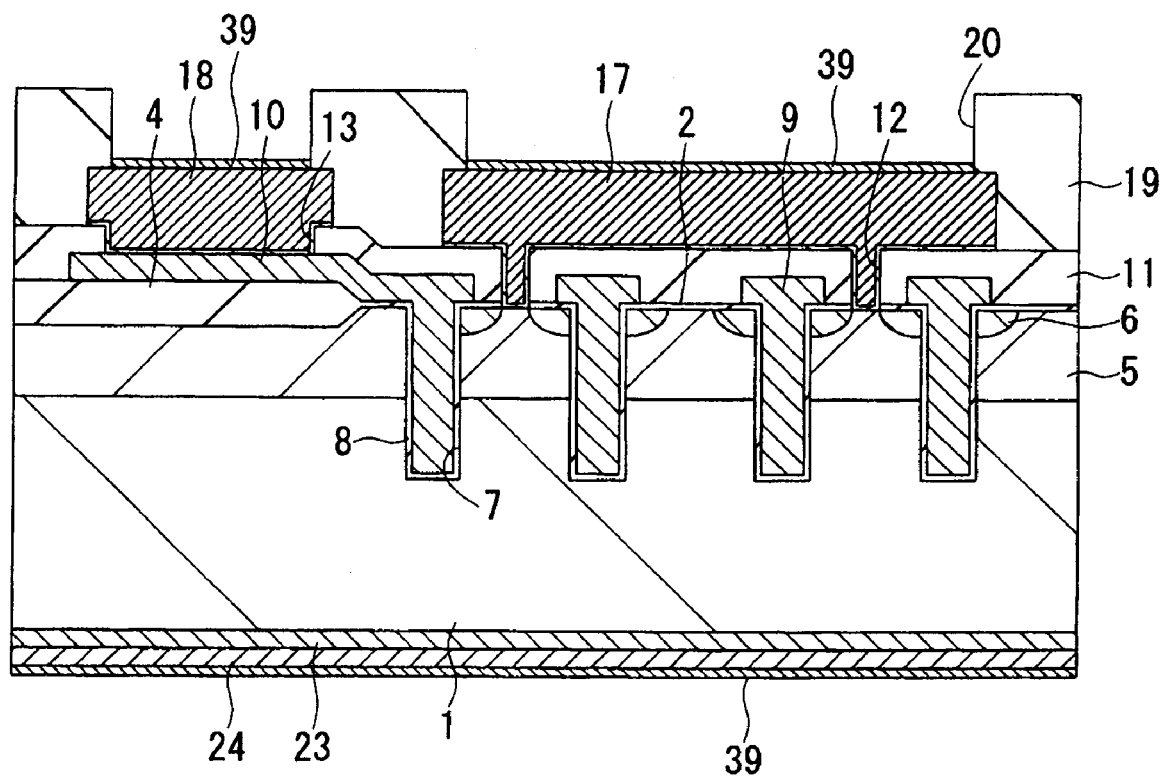
FIG. 44 is a fragmentary cross-sectional view explaining the manufacturing method of the semiconductor device according to Embodiment 3 of the invention.
Figure 45:
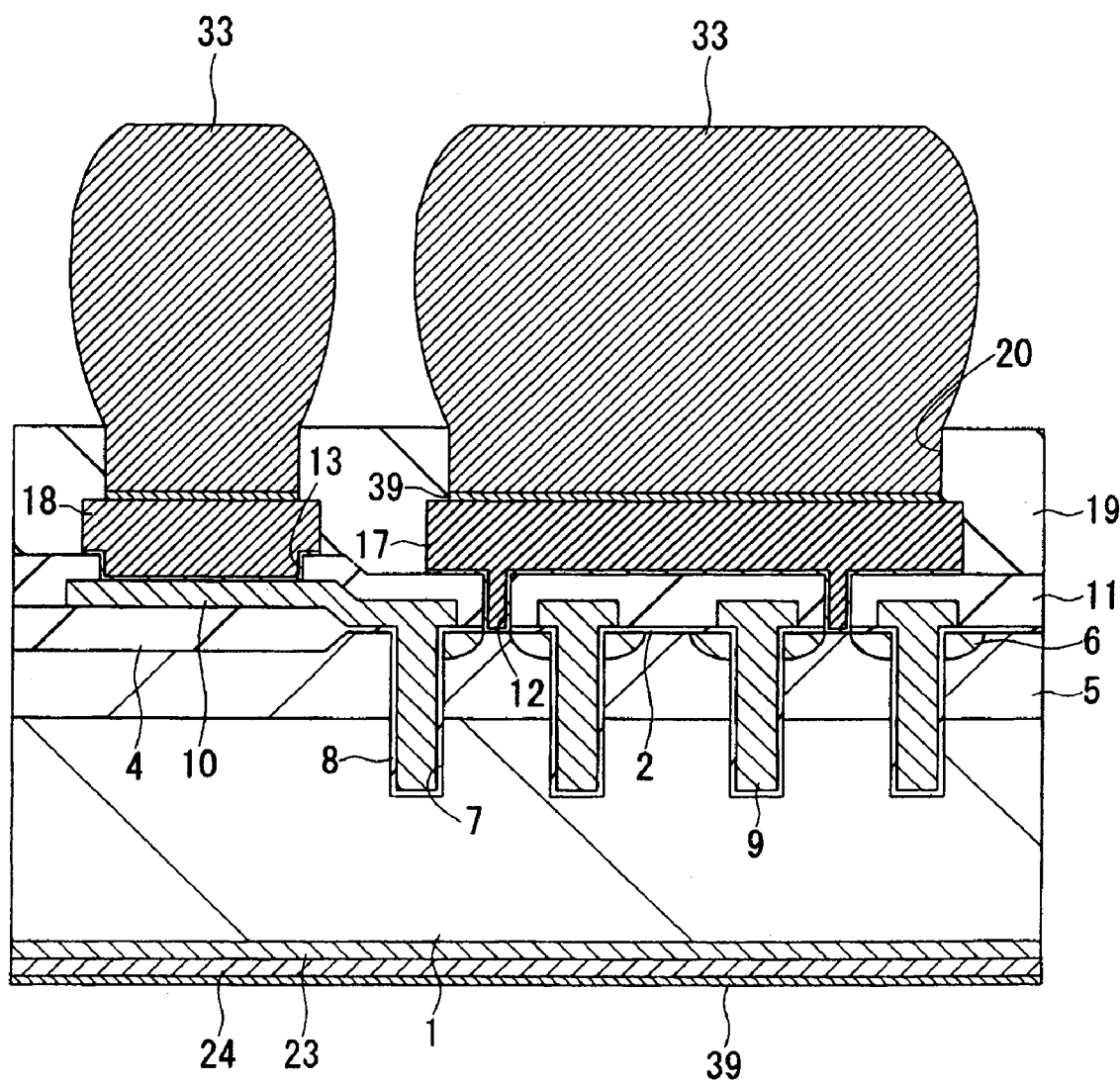
FIG. 45 is a fragmentary cross-sectional view illustrating the semiconductor device during its manufacturing step following that of FIG. 44.

Referring to FIGS. 43 to 45, a semiconductor device of Embodiment 3 will next be described in accordance with the manufacturing steps. FIG. 43 is a flow chart of the manufacturing process of the semiconductor device of Embodiment 3. Steps up to the formation of the collector region by ion implantation into the backside of the substrate and washing with hydrofluoric acid are similar to those shown in FIGS. 2 to 24 (Step P01 to Step P14 of FIG. 1) in Embodiment 1 so that a description on them is omitted and steps subsequent to them will next be described.

Following Step P14 (FIG. 1) of Embodiment 1, as illustrated in FIG. 44, conductive films (first and second metal films) 39 are formed (Step P15 of FIG. 43) by electroless plating over the backside of the substrate 1 and the surface of each of the interconnects 17 and 18 which have appeared from the bottom of the openings 20. The conductive film 39 is a film stack obtained by successively stacking, for example, a nickel film and a gold film. The nickel film has a thickness of about 4 μm, while the gold film has a thickness of about 80 nm. The alloy treatment is then performed to react the nickel film and the substrate (single crystal silicon) 1 on the backside of the substrate 1 (Step P16 of FIG. 43).

As illustrated in FIG. 45, with a metal mask patterned in accordance with the planar pattern of the openings 20, a solder paste is printed to embed the openings 20 therewith. By reflow treatment, bump electrodes 33 electrically connected to the interconnects 17 and 18 are formed (Step P17 of FIG. 43). The substrate 1 in the wafer form is then diced, for example, along dicing regions and separated into individual semiconductor chips.

According to Embodiment 3, a plating layer (conductive film 39) is formed over the exposed surfaces of the interconnects 17 and 18, which are on the surface side of the semiconductor substrate 1, and the back side of the substrate 1 simultaneously by electroless plating. This enables to shorten the manufacturing process.

Embodiment 4

In Embodiment 4, after formation of a collector region by ion implantation, a protective film which is the uppermost layer on the surface side of a substrate is formed and then a collector electrode and bump underlying film are formed in one step.

Figure 46:
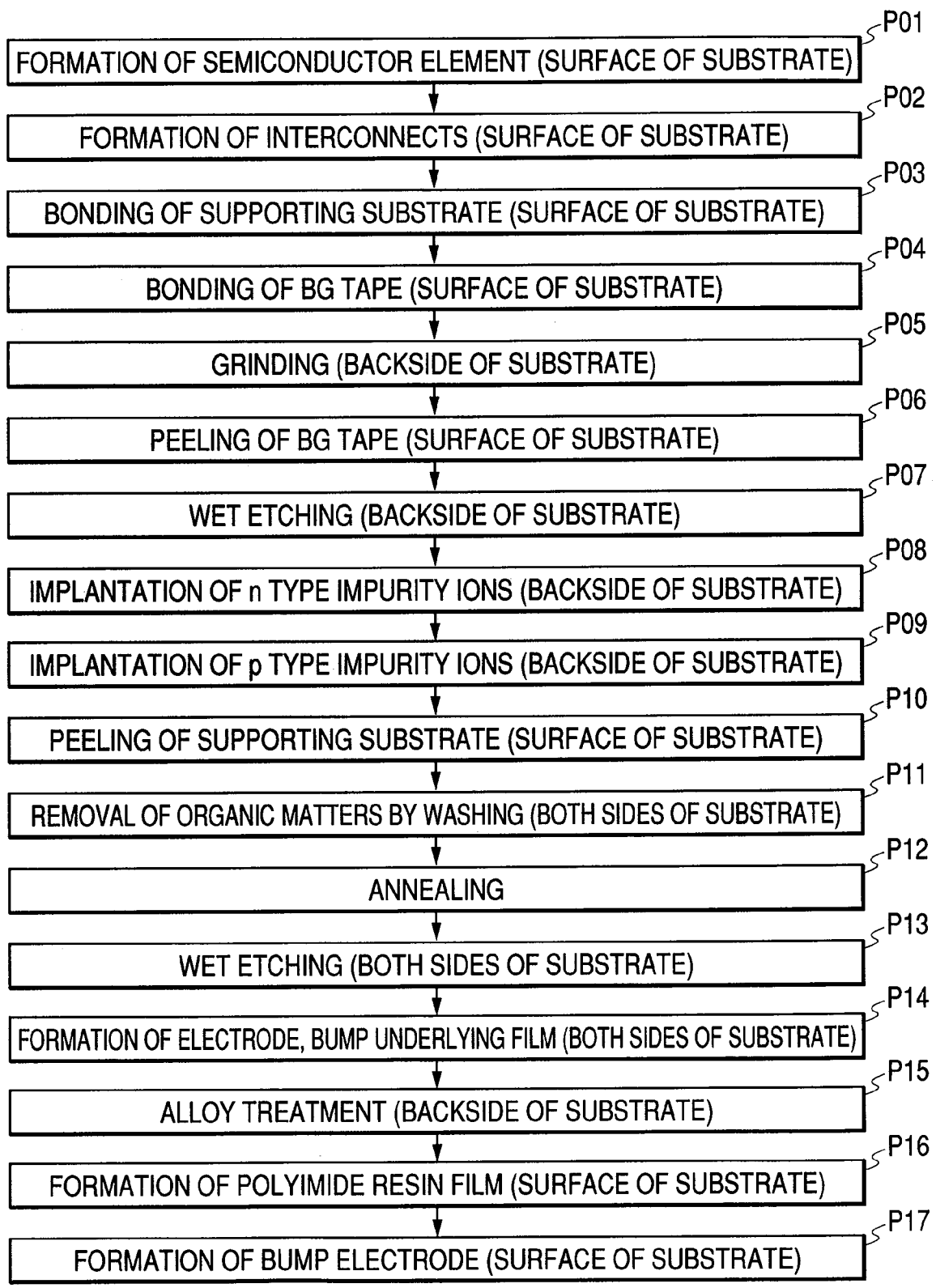
FIG. 46 is a flow chart for explaining a manufacturing method of a semiconductor device according to Embodiment 4 of the invention.
Figure 47:
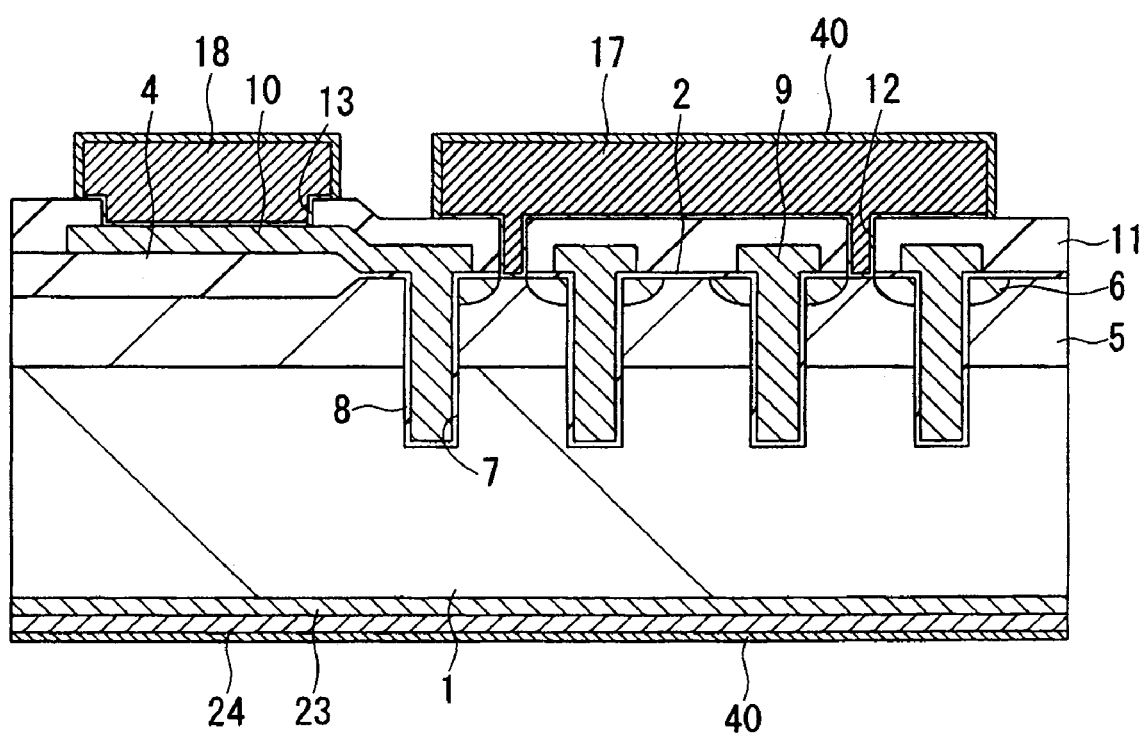
FIG. 47 is a fragmentary cross-sectional view explaining the manufacturing method of the semiconductor device according to Embodiment 4 of the invention.
Figure 48:
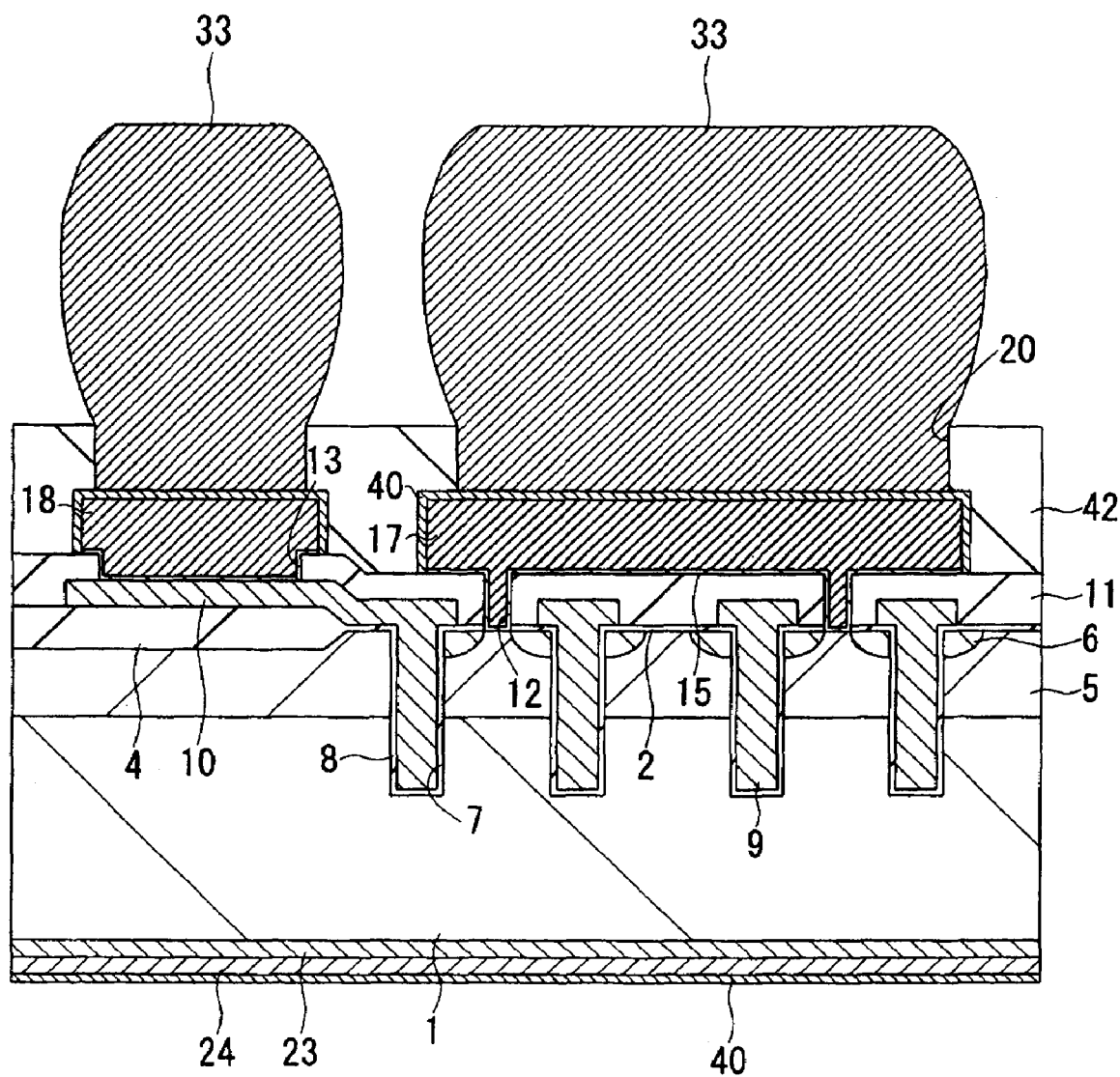
FIG. 48 is a fragmentary cross-sectional view illustrating the semiconductor device during its manufacturing step following that of FIG. 47.

Referring to FIGS. 46 to 48, the semiconductor device of Embodiment 4 will be described in accordance with the manufacturing steps. FIG. 46 is a flow chart of a manufacturing method of the semiconductor device according to Embodiment 4. Steps up to the formation of the collector region by ion implantation into the backside of the substrate and washing with hydrofluoric acid are similar to those shown in FIGS. 32 to 37 (Step P01 to Step P13 of FIG. 32) in Embodiment 2 so that a description on them is omitted and steps subsequent to them will next be described.

Following Step P13 (FIG. 32) of Embodiment 2, as illustrated in FIG. 47, conductive films (first and second metal films) 40 are formed by electroless plating over the backside of the substrate 1 and over the surfaces of the interconnects 17 and 18 which have appeared from the bottom of the openings 20 (Step P14 of FIG. 46). The conductive film 40 is similar to the conductive film 39 of Embodiment 3 and it is, for example, a film stack of a nickel film and a gold film. Then, alloy treatment is performed to react the nickel film and the substrate (single crystal silicon) 1 on the backside of the substrate 1 (Step P15 of FIG. 46).

As illustrated in FIG. 48, a polyimide resin film (protective film) 42 of about 10 μm thick is deposited. In Embodiment 4, the polyimide resin film 42 may be either a photosensitive or non-photosensitive film (Step P16 of FIG. 46). With a photoresist film patterned by photolithography as a mask, the polyimide resin film 42 is etched to form openings 20 while leaving the polyimide resin film 42 in the other region.

With a metal mask patterned in accordance with the planar pattern of the openings 20, a solder paste is printed to embed the openings 20 therewith. By reflow treatment, bump electrodes 33 electrically connected to the interconnects 17 and 18 are formed (Step P17 of FIG. 46). The substrate 1 in the wafer form is then diced along dicing regions and separated into individual semiconductor chips.

According to Embodiment 4, even in the manufacturing method of forming the polyimide resin film 42 after implantation of an impurity ion into the backside of the substrate 1 and heat treatment, a plating layer (conductive film 40) can be formed on the surfaces of the interconnects 17 and 18 which exist on the surface side of the substrate 1, and on the backside of the substrate 1 simultaneously. This enables to shorten the manufacturing process.

The invention made by the present inventors has so far been described specifically based on some embodiments of the invention. It should however be borne in mind that the present invention is not limited to them, but can be changed within an extent not departing from the gist of the invention.

Description was made with IGBT as an element formed over a semiconductor substrate. This invention can also be applied to a semiconductor device having an element such as power MISFET (Metal Insulator Semiconductor Field Effect Transistor) formed thereon. The invention can also be applied not only to a power transistor but also to a semiconductor device in which a solder bump is connected to a thinned semiconductor wafer.

Advantages available by the typical inventions disclosed by the embodiments will next be described briefly.

Foreign materials can be removed by causing them to stick to the surface of the BG tape and then peeling off the BG tape. This makes it possible to prevent adhesion of foreign matters onto the backside of the semiconductor substrate, and in turn, to prevent generation of defects resulting from these foreign materials in a semiconductor region formed by ion implantation of an impurity into the backside of the semiconductor substrate and heat treatment subsequent to the peeling. As a result, a production yield of the semiconductor device having, for example, IGBT can be improved.

The semiconductor device according to the present invention can be applied a motor driving module to be loaded on automobiles.

What is claimed is:

1. A semiconductor device, comprising:
   a semiconductor element formed on a first surface side of a semiconductor substrate of a first conductivity type;
   an electrode formed over the first surface side and electrically connected to the semiconductor element;
   a protective film covering therewith a periphery of an upper surface and a side surface of the electrode, such that a portion of the upper surface is not covered with protective film;
   a first metal film formed over the portion of the upper surface not covered with the protective film;
   a first semiconductor region, of a second conductivity type opposite to the first conductivity type, formed by introducing an impurity into a second surface side of the semiconductor substrate which is a side opposite to the first surface side of the semiconductor substrate; and
   a second metal film electrically connected to the first semiconductor region and contacting the first semiconductor region.

2. A semiconductor device according to claim 1, wherein the first metal film and the second metal film are comprised of the same material and substantially equal in thickness.

3. A semiconductor device according to claim 2, wherein the first metal film and second metal film each includes a film having nickel as a main component.

4. A semiconductor device according to claim 1, wherein the semiconductor substrate has a thickness of from about 50 to 200 μm.

5. A semiconductor device according to claim 1, wherein the electrode is connected to a bump electrode via the first metal film.

6. A semiconductor device according to claim 1, wherein the semiconductor element comprises a trench-gate type transistor,
   wherein the trench-gate type transistor includes a trench formed in the semiconductor substrate, a gate insulating film formed on the trench, a gate electrode formed on the gate insulating film and formed in the trench, the first semiconductor region of the second conductivity type formed in the semiconductor substrate and a second semiconductor region of the first conductivity type formed in the semiconductor substrate, and
   wherein the second semiconductor region is formed at a position shallower than the first semiconductor region such that the second semiconductor region contacts the trench.

7. A semiconductor device, comprising:
   a semiconductor element formed on a main surface side of a semiconductor substrate of a first conductivity type, the semiconductor element including a trench formed in the semiconductor substrate, a gate insulating film formed on the trench, a gate electrode formed on the gate insulating film and formed in the trench, a first semiconductor region of a second conductivity type opposite to the first conductivity type formed in the semiconductor substrate and a second semiconductor region of the first conductivity type formed in the semiconductor substrate, and the second semiconductor region being formed at a position shallower than the first semiconductor region such that the second semiconductor region contacts the trench;
   an electrode formed over the main surface side and electrically connected to the semiconductor element;
   a protective film covering a periphery of an upper surface and a side surface of the electrode such that a portion of the upper surface is not covered with the protective film;
   a first metal film formed over the portion of the upper surface not covered with the protective film;
   a third semiconductor region of the second conductivity type formed by introducing an impurity into a back surface side of the semiconductor substrate which is a side opposite to the main surface side of the semiconductor substrate; and
   a second metal film electrically connected to the third semiconductor region and contacting the third semiconductor region.

8. A semiconductor device according to claim 7, wherein the first metal film and the second metal film are comprised of the same material and substantially equal in thickness.

9. A semiconductor device according to claim 7, wherein the first metal film and the second metal film each include a film having nickel as a main component.

10. A semiconductor device according to claim 7, wherein the semiconductor substrate has a thickness of about 50 to 200 μm.

11. A semiconductor device according to claim 7, wherein the electrode is connected to a bump electrode via the first metal film.

12. A semiconductor device according to claim 7, wherein the second semiconductor region serves as an emitter region, the first semiconductor region serves as a channel region, and the third semiconductor region serves as a collector region of a transistor.

13. A semiconductor device according to claim 7, wherein the third semiconductor region serves as an emitter region, the second semiconductor region serves as a channel region, and the first semiconductor region serves as a collector region of the trench-gate type transistor.

14. A semiconductor device according to claim 7, wherein, before introducing the impurity into the second surface side of the semiconductor substrate, the semiconductor substrate is ground from the side opposite to the main surface of the semiconductor substrate so as to reduce a thickness of the substrate.

* * * * *